US006407481B1

(12) United States Patent
Takeuchi et al.

(10) Patent No.: US 6,407,481 B1
(45) Date of Patent: Jun. 18, 2002

(54) PIEZOELECTRIC/ELECTROSTRICTIVE DEVICE HAVING CONVEXLY CURVED DIAPHRAGM

(75) Inventors: Yukihisa Takeuchi, Aichi; Kazuhiro Yamamoto, Kasugai; Koji Kimura, Nagoya, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/516,947

(22) Filed: Mar. 1, 2000

(30) Foreign Application Priority Data

Mar. 5, 1999 (JP) .............................. 11-059502

(51) Int. Cl.[7] ...................... H01L 41/04; H01L 41/083; H01L 41/18
(52) U.S. Cl. ...................... 310/324; 310/328; 310/800
(58) Field of Search .................. 310/324, 328, 310/330, 331, 800

(56) References Cited

FOREIGN PATENT DOCUMENTS

| JP | 6-204580 | 7/1994 |
|----|----------|--------|
| JP | 8-51241  | 2/1996 |
| JP | 10-136665 | 5/1998 |

OTHER PUBLICATIONS

Uchino, Kenchi, *Piezoelectric/Electrostrictive Actuator*, edited by Japan Industrial Technique Center and published by Morikita Shuppan, pp. 164–166 and pp. 177–178, No Date Available.

Nakamura, S. et al., "An Electrostatic Micro Actuator for a Magnetic Head Tracking System of Hard Disk Drives," Transducers '97, 1997 International Conference on Solid-State Sensors and Actuators, pp. 1081–1084.

*Primary Examiner*—Brian Sircus
*Assistant Examiner*—Michael C. Zarroli
(74) *Attorney, Agent, or Firm*—Burr & Brown

(57) ABSTRACT

A piezoelectric/electrostrictive device is formed with a connecting plate, a diaphragm, and a substrate which are mutually joined. A joining direction of the connecting plate with the substrate and a joining direction of the connecting plate with the diaphragm are mutually intersected to form a cross. The diaphragm is straddled between the connecting plate and the substrate. A piezoelectric element is arranged on a surface of the diaphragm, and the diaphragm is convexly curved in a direction perpendicular to the two directions forming the cross. The piezoelectric/electrostrictive device is an element for converting electrical energy into mechanical energy such as a mechanical displacement, force or vibrations. Conversely, the piezoelectric/electrostrictive device may be employed to convert mechanical energy into electrical energy, as well as improve the operational characteristics thereof.

36 Claims, 18 Drawing Sheets

Fig.9A
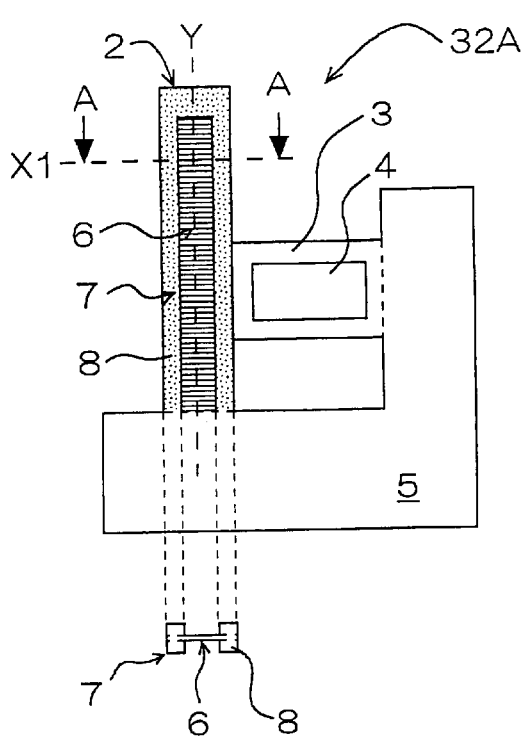
Fig.9B
Fig.9C
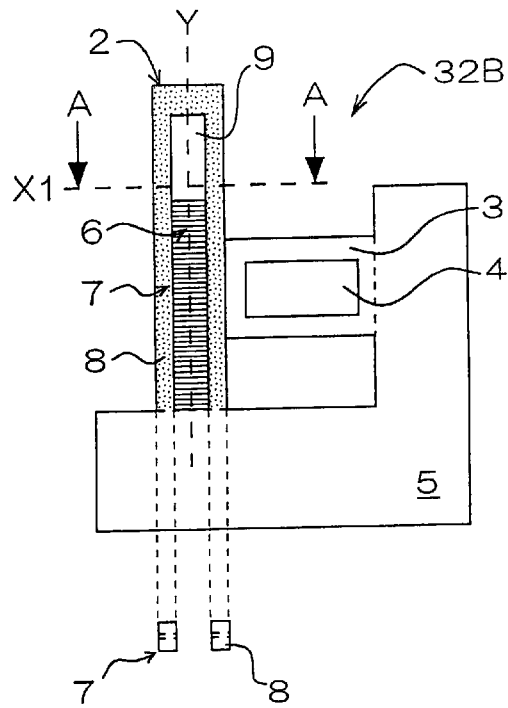
Fig.9D
Fig.10
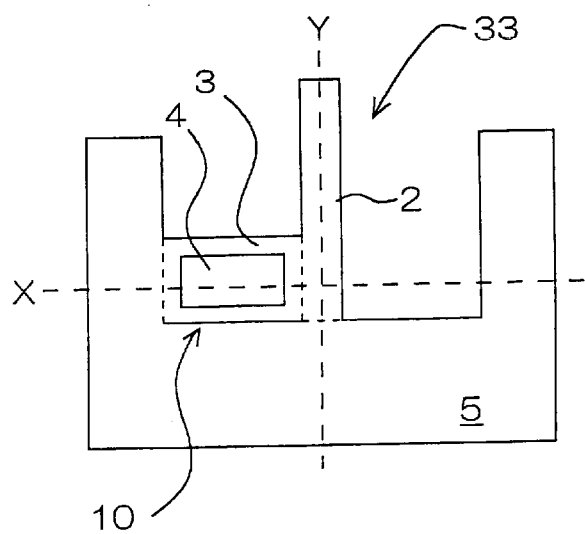

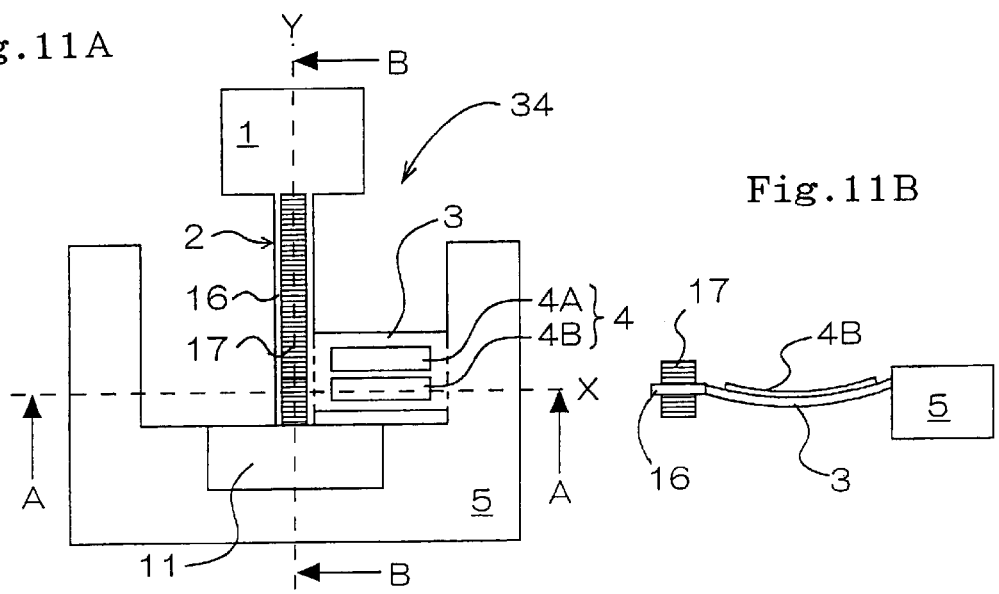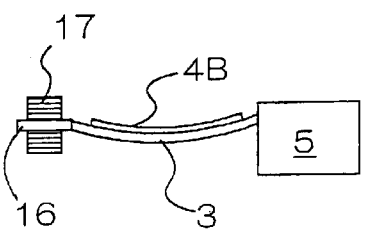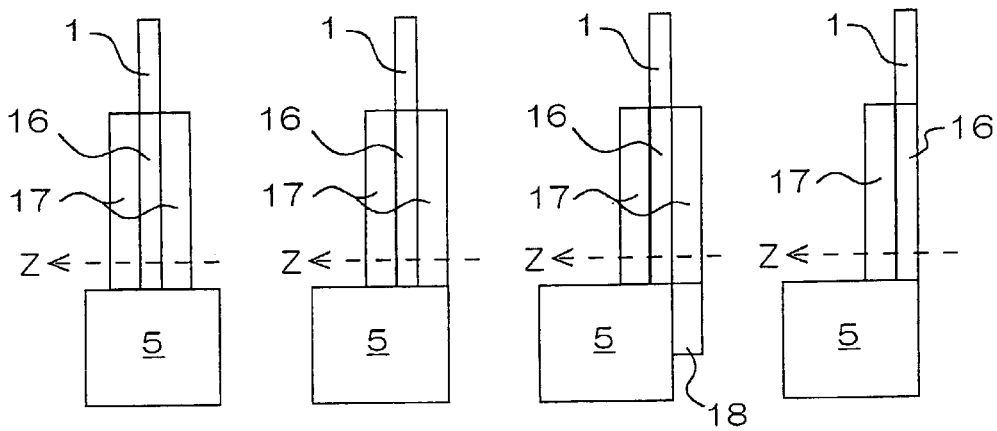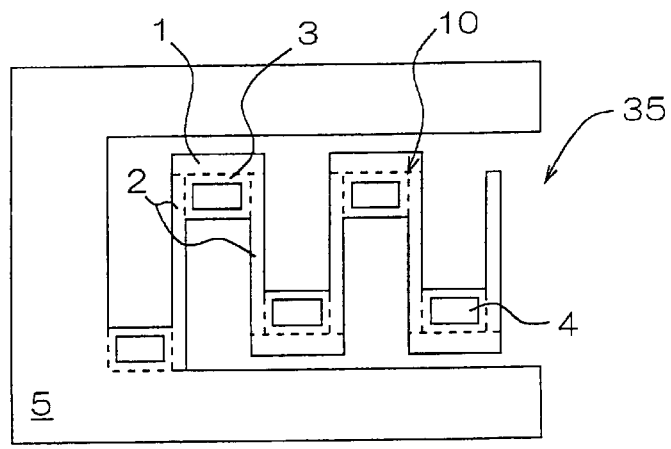

Fig.15A
Fig.15B
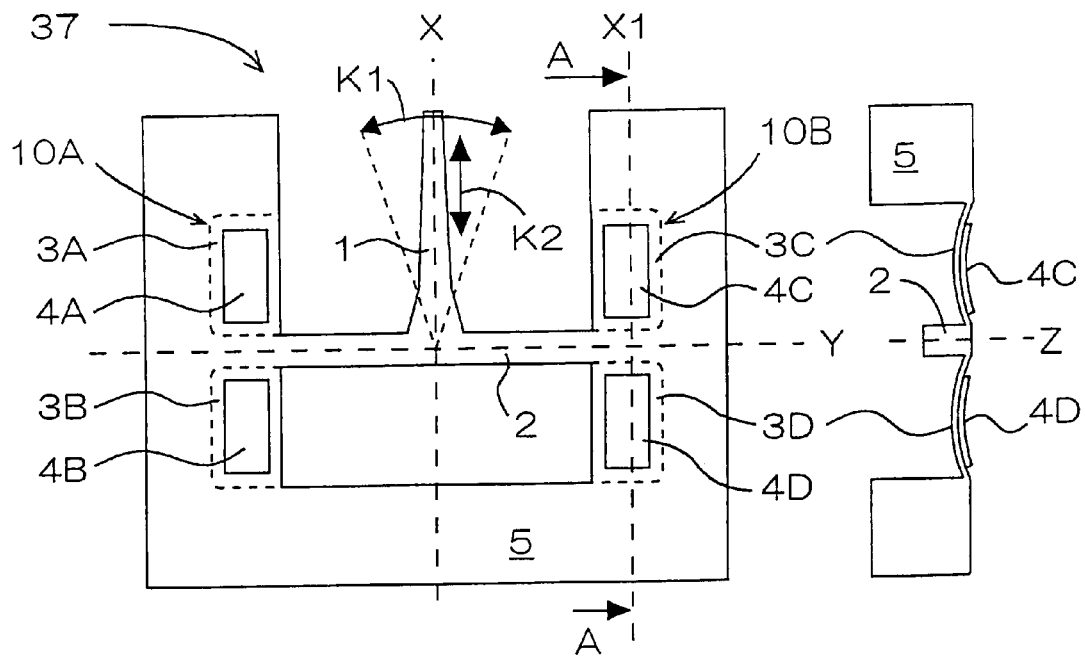
Fig.16
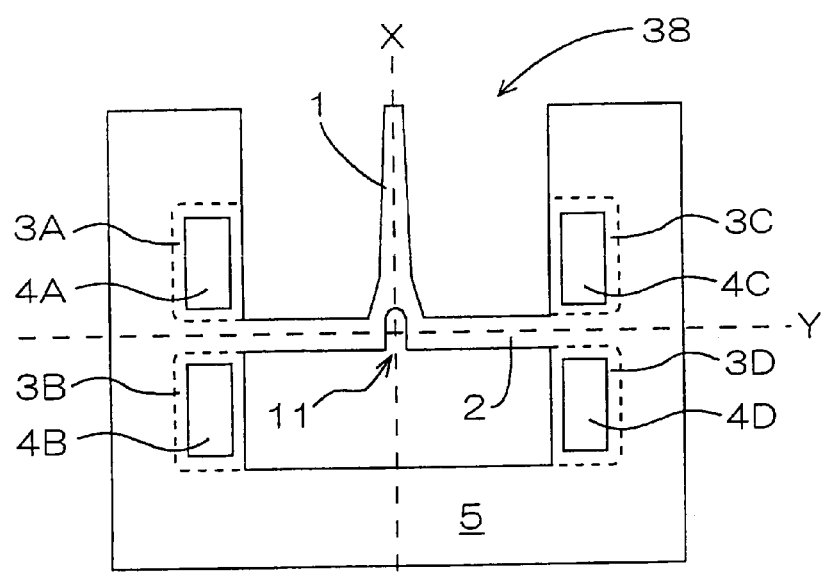

Fig.20A
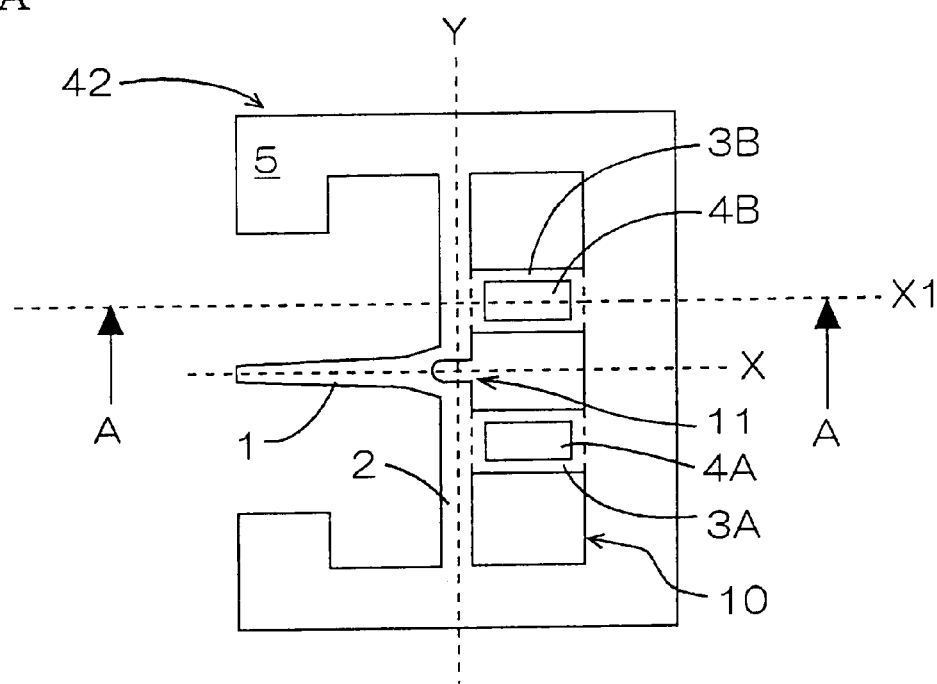
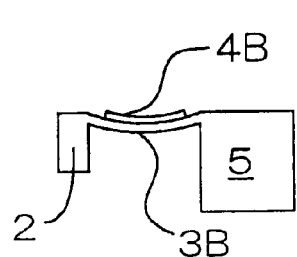
Fig.20B
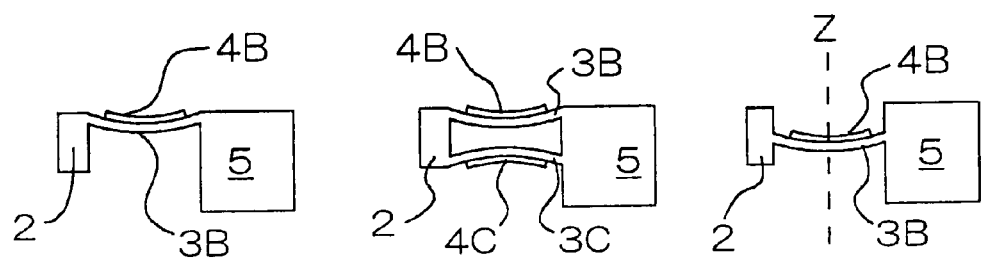
Fig.20C
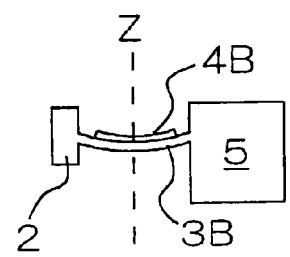
Fig.20D

DRIVING SIGNAL A

DRIVING SIGNAL B

PIEZOELECTRIC/ELECTROSTRICTIVE DEVICE HAVING CONVEXLY CURVED DIAPHRAGM

BACKGROUND OF THE INVENTION

1. Field of the Invention

The present invention relates to a device using a piezoelectric/electrostrictive film, and more particularly relates to the structure of a piezoelectric/electrostrictive device for improving an operational characteristic of a piezoelectric/electrostrictive device in an element for converting electrical energy into mechanical energy such as mechanical displacement, mechanical force, and vibration, and for converting in reverse. Concretely, the present invention relates to a piezoelectric/electrostrictive device to be preferably utilized in a variety of sensors, such as transducers, a variety of actuators, frequency-region functional components (filters), transformers, vibrators and resonators for communication and motive power, oscillators, discriminators, ultrasonic sensors and acceleration sensors, angular velocity sensors and impact sensors, mass sensors, or the like, and moreover to be applied to unimorph- and bimorph-type elements used for servo displacement elements described in "From Foundation up to Application of Piezoelectric/Electrostrictive Actuator" written by Kenji Uchino (edited by Japan Industrial Technique Center and published by MORIKAWA SHUPPAN), and to be preferably employed to a variety of actuators used for mechanisms for displacement and positioning adjustment and angle adjustment of a variety of precision components, or the like, of an optical apparatus and a precision apparatus, or the like.

2. Description of the Related Art

Recently, there has been a requirement for a displacement control element for adjusting an optical-path length or a position in sub-micron order in optical and magnetic recording fields and precision machining fields. Responding to the requirement, development has been progressed of a piezoelectric/electrostrictive actuator or the like which is an element utilizing a displacement based on the reverse piezoelectric effect or the electrostrictive effect caused when an electric field is applied to a piezoelectric/electrostrictive material such as a ferroelectric substance or the like.

In a magnetic recording field represented by a hard disk, among the above mentioned fields, particularly a storage capacity has been remarkably increased in these years, and this is because an attempt has been made to increase the recording density per se by increasing the number of recording tracks for more effective use of recording mediums, in addition to the improvement of a recording method of write/read.

So far, such attempt has been made mainly on the improvement of a voice coil motor, however, an attempt is introduced as a new technique, for example, in a preprint manuscript of "1997 International Conference on Solid-State Sensors and Actuators" of "TRANSDUCERS '97", pp. 1081–1084, that an electrostatic-type micro-actuator fabricated by micro-machine processing of Si or Ni is applied to the tracking system of a hard-disk magnetic head.

Moreover, Japanese Unexamined Patent Publication No. 10-136665 discloses a piezoelectric/electrostrictive actuator 101, as shown in FIG. 26, wherein a fixing portion 103 and a movable portion 104 and at least one beam portion 102 constituted therewith are integrally formed by arranging at least one hole on a plate-shaped body composed of a piezoelectric/electrostrictive material, a displacement generating portion is constituted by providing an electrode layer 105 such that an expansion and a contraction is caused in a direction connecting the fixing portion 103 with the movable portion 104 on at least a part of the at least one beam portion 102, and a displacement of the movable portion 104 relative to the fixing portion 103 generated by the expansion or the contraction of the displacement generating portion becomes an arc-shaped displacement or a rotational displacement in-plane of the plate-shaped body.

However, with a conventional art for positioning a recording head primarily using a voice coil motor, it is difficult to accurately position the recording head so as to accurately trace tracks thereof by increasing the number of the tracks, in order to respond to the further increase in capacity.

Further, although the above-described art using the electrostatic-type micro-actuator is an art to obtain a displacement by a voltage applied between a plurality of plate-shaped electrodes formed by the micro-machining, structurally, it is difficult to raise a resonant frequency, and as the result, a problem is immanent that vibrations are hardly attenuated when operated at a high speed. Furthermore, in view of the principle of displacement, there is a feature that the linearity of the voltage-displacement property is inferior, and from a viewpoint of an accurate positioning, there are many problems to be solved. Furthermore, the process of micro-machining per se is problematical in the fabrication cost.

Moreover, since the piezoelectric actuator 101 disclosed in Japanese Unexamined Patent Publication No. 10-136665 has a piezoelectric operating portion (a portion where a displacement is caused by distortion of a piezoelectric film) of a monomorph structure, an axis of the main distortion of a piezoelectric body naturally becomes coaxial or parallel with an axis of the main displacement of the piezoelectric operating portion, thus there is a problem that a displacement generated at the piezoelectric generating portion per se is small, and a displacement of a movable portion is also small. Furthermore, the piezoelectric actuator 101 per se is heavy, and as described in the official gazette of Japanese Unexamined Patent Publication No. 10-136665, it is likely to be influenced by harmful vibrations for operation, for example, residual vibrations and vibrational noises, for example, when operated at a high speed, making it necessary to suppress the harmful vibrations by filling a hole with a filler. However, the use of such filler is likely to unfavorably influence upon a displacement of the movable portion. Further, since the piezoelectric actuator 101 is constituted unavoidably with a piezoelectric/electrostrictive material per se which is inferior in mechanical strength, there is also a problem that the actuator is likely to be subjected to limitation of a shape and a use application due to the strength of the material.

SUMMARY OF THE INVENTION

The present invention is made in view of the problems of a piezoelectric/electrostrictive device described above, and it is the object of the present invention is to produce a piezoelectric/electrostrictive device which is made capable of performing precise operation at a high speed with a low power, and is roughly classified into three categories as described hereinafter. It should be noted that "piezoelectric" of a piezoelectric element, a piezoelectric film, and piezoelectric ceramics used in the present invention includes meanings of both "piezoelectric" and "electrostrictive".

According to the present invention, provided as a first piezoelectric/electrostrictive device is characterized in that a connecting plate, a diaphragm, and a substrate are mutually joined together such that a joining direction of the connecting plate with the substrate and a joining direction of the connecting plate with the diaphragm are mutually intersected to form a cross, and the diaphragm is straddled between the connecting plate and the substrate, a piezoelectric element is arranged on at least a part of at least one surface of the diaphragm, and the diaphragm is convexly curved in a direction perpendicular to two directions by which said cross is formed.

In this first piezoelectric/electrostrictive device, a fixing plate is also preferably joined with an end of the connecting plate. Other devices, parts, or the like of a magnetic head or the like may also be preferably fixed to a tip or the like of the connecting plate. Further, a larger displacement is also made obtainable by a structure wherein a connecting plate and a fixing plate are alternately joined to be a meandering shape, and a diaphragm with a piezoelectric element arranged thereon is straddled between neighboring connecting plates.

As to displacement modes of the first piezoelectric/electrostrictive device, there is at least any one of the displacement modes including, the $\theta$ displacement mode wherein a connecting plate is swingably displaced in a joining direction of the connecting plate with a diaphragm, when a joining surface of the connecting plate with a substrate is made as a fixed plane, and the central axis perpendicularly penetrating through the center of the fixed plane is made as the reference, the $\phi$ displacement mode wherein a displacement component in a direction perpendicular to both directions of a joining direction of the connecting plate with the diaphragm and an extending direction of the central axis is added to the $\theta$ displacement mode as away from the central axis, the $v$ displacement mode wherein the connecting plate is uniaxially displaced in a joining direction of the connecting plate with the diaphragm, or the vz displacement mode wherein a displacement component in a direction perpendicular to both directions of a joining direction of the connecting plate with the diaphragm and an extending direction of the central axis is added to the $\theta$ displacement mode as away from the central axis. It should be noted that although these displacement modes mainly comprise components in the previously described directions, components in other displacement directions are not totally excluded.

Now, according to the present invention, a second piezoelectric/electrostrictive device is provided characterized in that a fixing plate, a connecting plate, and a diaphragm are mutually joined such that a direction where the connecting plate interposes the fixing plate and a direction where the diaphragm interposes the connecting plate are mutually intersected to form a cross, the connecting plate is joined with bottom surfaces of opposite recess portions formed on a substrate, the diaphragm is joined with sides of the recess portions, a piezoelectric element is arranged on at least a part of at least one surface of the at least one diaphragm, and the diaphragm with the piezoelectric element arranged thereon is convexly curved in a direction perpendicular to two directions forming the cross.

In the second piezoelectric/electrostrictive device, the width of a connecting plate in a direction in which the connecting plate is interposed by the diaphragm may also preferably be respectively different, and the diaphragm may also be arranged so as to be joined also with a fixing plate. As a displacement mode, preferably used is either the uniaxial displacement mode, which is a planar directional displacement of the fixing plate, wherein the fixing plate is uniaxially displaced in a direction parallel to a direction in which the connecting plate is interposed by the diaphragm, or the rotational displacement mode wherein the fixing plate is rotated about the substantially central portion of the fixing plate.

In the above described first and the second piezoelectric/electrostrictive devices, it is also preferable to arrange one or more slits and/or holes, and/or to form a thin portion and a thick portion in said connecting plate. In this case a planar displacement is made efficiently obtainable.

Next, a third piezoelectric/electrostrictive device is provided characterized in that a connecting plate is straddled between bottom surfaces of opposite recess portions formed on a substrate, in the respective recess portions, at least one diaphragm is straddled between the connecting plate and side of the recess portion, a fixing plate is joined with a connecting plate so that the longitudinal direction of the fixing plate is to be in parallel with a straddling direction of the diaphragm, and a piezoelectric element is arranged on at least a part of at least one surface of the at least two diaphragms, and the diaphragm is convexly curved in a direction perpendicular to both directions of the straddling direction of the diaphragm and the straddling direction of the connecting plate.

Also, in the third device, it is preferable to make a piezoelectric/electrostrictive device in a configuration characterized in that a connecting plate, one end thereof in longitudinal direction is interposed by at least two diaphragms, and the other end thereof is interposed by at least other two diaphragms is straddled between bottom surfaces of opposite recess portions formed on the substrate, the diaphragm is joined with sides of the recess portions, a fixing plate is joined with the connecting plate such that a longitudinal direction of the fixing plate is made to be in parallel with a direction in which the connecting plate is interposed by the diaphragm, and a piezoelectric element is arranged on at least a part of at least one surface of at least two diaphragms, and the diaphragm is convexly curved in a direction perpendicular to both directions of a direction in which the connecting plate is interposed by the diaphragm and the straddling direction of the connecting plate.

In the third piezoelectric/electrostrictive device, a notch is preferably formed at a joint of a fixing plate with a connecting plate. Further, a fixing plate may be joined so as to be intersected with a connecting plate. Further, it is also preferable to have a structure that a connecting plate is split into at least two in the longitudinal direction of a fixing plate, and at least two connecting plates which are formed by splitting are joined with the fixing plate. In the above-described case where a notch is provided, if a hinge is provided on a fixing plate from the joint of the fixing plate with the connecting plate along a longitudinal direction of the fixing portion, a displacement can be enlarged, which is preferable.

In the third piezoelectric/electrostrictive device, preferably employed is a method wherein one set of piezoelectric elements which are positioned in diagonal positions are driven in the same phase about the joint of the fixing plate with the connecting plate as the center, and the other set of piezoelectric elements are driven in an opposite phase, or one set of piezoelectric elements and the other set of piezoelectric elements are driven in the same phase with a shifted time. On the other hand, one set of piezoelectric elements which are positioned in axial symmetry about an axis in the longitudinal direction of the fixing plate as the axis of symmetry are driven in the same phase and the other set of piezoelectric elements in the opposite phase, or one set of piezoelectric elements are driven in an opposite phase, or the other set of piezoelectric elements may be driven in the same phase with a shifted time. Meanwhile, a pair of diaphragms which interposes said connecting plate may be respectively joined with a connecting plate at a position shifted in the thickness direction of the connecting plate, and it is also preferable that a piezoelectric element is arranged on a planar surface of one of respective diaphragms about the middle point of a joint of two diaphragms interposing a connecting plate with a connecting plate as the center of the point symmetry, and the piezoelectric element is driven in the same phase.

As a displacement mode of the third piezoelectric/electrostrictive device preferably employed is at least any of the displacement modes of the uniaxial displacement mode in which displacement is performed uniaxially in the longitudinal direction of the fixing plate, the in-plane rotational displacement mode having vicinity of the joint of a fixing portion with a connecting plate as the center of rotation, or the axially rotational displacement mode having an axis in the longitudinal direction of the connecting plate as the rotational center. The in-plane rotational displacement mode of the third piezoelectric/electrostrictive device is characterized in that it is based on an enlargement mechanism which enlarges a displacement of a piezoelectric device in two stages.

In the piezoelectric/electrostrictive device described above of the present invention, it is also preferable to have a structure in which one fixing plate is joined with a connecting plate in number of piezoelectric/electrostrictive devices. Further, as a convex shape of a diaphragm, when the length of a diaphragm in the straddling direction is set L, and to be the height of a curvature in the convex direction is set to be H, it is preferable if a relation at least of $1 \leq (H/L) \times 100 \leq 30$ is satisfied, and it is more preferable if a relation of $1 \leq (H/L) \times 100 \leq 10$ is satisfied. Further, it is preferable that at least a connecting plate and a diaphragm are joined together on the mutual sides. Namely, it is preferable if a connecting plate is displaced in the rigid body mode. If at least a connecting plate, a diaphragm, and a substrate are integrally formed, it is preferable as the reliability of the joint is raised. Of course, when a fixing plate is arranged, it is also preferable that the fixing plate is joined at the side thereof in the similar way, and it is integrally formed with the connecting plate. Such integrated structure can easily be obtained by forming at least the connecting plate, the diaphragm, and the substrate, by use of the green sheet laminating method. In this case, a fixing plate can easily be integrally formed in a similar way.

One piezoelectric element may be split into a plurality thereof, and in this case, it is preferable that at least one split piezoelectric element is used as a driving element, and at least one other piezoelectric element is used as an auxiliary element. Further, irrespective of whether one piezoelectric element is split or not, when two or more piezoelectric elements are arranged, it is also preferable that at least one piezoelectric element is used as a driving element, and at least one other piezoelectric element is used as an auxiliary element. Further, it should be noted that an auxiliary element here means a trouble diagnosing element, a displacement confirming and judging element, a driving assisting element, or the like.

An electrode lead for causing a current to flow to a piezoelectric element or an electrode of the piezoelectric element is, when coated by an insulating layer composed of a resin or glass, preferably improves the humidity resistance. If a resin is used here, a resin fluorite or a silicone resin may be preferably used. When an insulating layer is formed, it is preferable to form a shielding layer composed of a conductive material on the surface thereof.

As a material of a substrate, a fixing plate, a connecting plate, and a diaphragm, fully-stabilized zirconia or partially-stabilized zirconia is preferably used. On the other hand, for a piezoelectric film at a piezoelectric element, a material containing lead zirconate, lead titanate, or lead magnesium niobate as the major component is preferably used. A shape of at least any of the fixing plate, the connecting plate, and the diaphragm can be easily adjusted of the dimensions thereof by trimming by use of the laser machining or the mechanical machining, and it is also preferable to adjust the available electrode area of the piezoelectric element by machining the electrode in the piezoelectric element by use of the laser machining or the mechanical machining.

By the way, if a piezoelectric/electrostrictive device according to the present invention is compared with the piezoelectric actuator 101 described above in the official gazette of Japanese Unexamined Patent Publication No. 10-136665, the piezoelectric/electrostrictive device according to the present invention has a unimorph- or bimorph-type structure having a diaphragm, and thus has a feature that the axis for main distortion of a piezoelectric film and the axis for main displacement of a piezoelectric operating portion have mutually different directions, and a distortion of the piezoelectric film can be enlarged using this feature, and thus a large displacement of the fixing plate can be obtained. Further, the piezoelectric/electrostrictive device of the present invention can have functions thereof divided, and as a substrate and the like except a piezoelectric film can be composed of a material containing zirconia, which is superior in the mechanical strength and the rigidity, as the major component thereof, there is an advantage that a device, having desired strength, and compactified, thinner in thickness, and lighter in weight, can be obtained. Further, there is a feature that the device can be scarcely influenced from the outside to the displacement property, and therefore a filler or the like is unrequited.

BRIEF DESCRIPTION OF THE DRAWINGS

FIGS. 9A and 9C show plan views and FIGS. 9B and 9D show sectional views of another embodiment of a piezoelectric/electrostrictive device of the present invention;

FIG. 10 shows a plan view of still another embodiment of a piezoelectric/electrostrictive device of the present invention;

FIG. 11A shows a plan view and FIGS. 11B to 11F show sectional views of still another embodiment of a piezoelectric/electrostrictive device of the present invention;

FIG. 12 shows a plan view of still another embodiment of a piezoelectric/electrostrictive device of the present invention;

FIG. 15A show a plan view and FIG. 15B show a sectional view of still another embodiment of a piezoelectric/electrostrictive device of the present invention, and thereof;

FIG. 16 shows a plan view of still another embodiment of a piezoelectric/electrostrictive device of the present invention;

FIG. 20A shows a plan view, and FIGS. 20B, 20C, and 20D show sectional views of still another embodiment of a piezoelectric/electrostrictive device of the present invention;

DESCRIPTION OF THE PREFERRED EMBODIMENTS

Embodiments of a piezoelectric/electrostrictive device (hereinafter referred to as "device") of the present invention are hereinafter described with reference to drawings. However, the present invention is not limited to the embodiments described hereinafter.

Figure 1A:
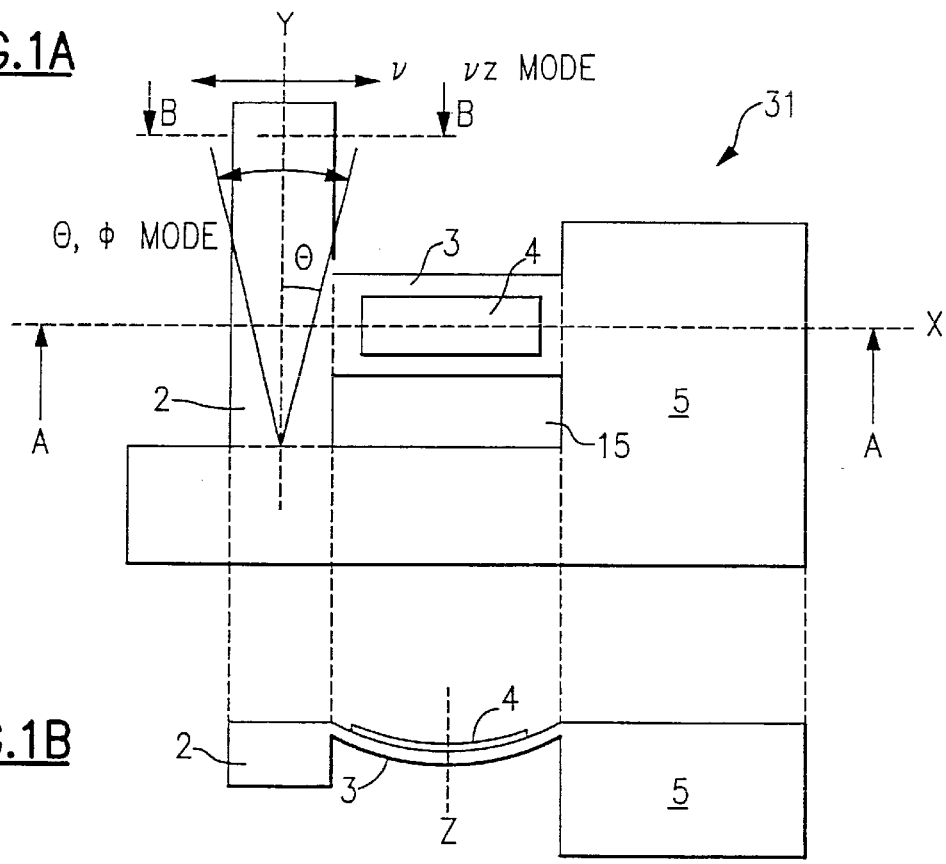
FIG. 1A shows a plan view and FIGS. 1B, and 1C show sectional views of a basic structure of a piezoelectric/electrostrictive device of the present invention.

FIG. 1A shows a plan view of a basic structure of a first device according to the present invention. A device 31 has such a structure that a connecting plate 2, a diaphragm 3, and a substrate 5 are mutually joined together such that a joining direction (Y-axis direction. Similarly hereinafter) of the connecting plate 2 and the substrate 5 and a joining direction (X-axis direction. Similarly hereinafter) of the connecting plate 2 and the diaphragm 3 are mutually intersected to form a cross, namely orthogonally crossed, and the diaphragm 3 is straddled between the connecting plate 2 and the substrate 5, and in the Y-axis direction, a window 15 is formed between the substrate 5 and the diaphragm 3. Accordingly, in order to straddle the diaphragm 3, the substrate 5 is required to have a shape such that a side is had respectively on both directions of the X-axis and the Y-axis.

Figure 1B:
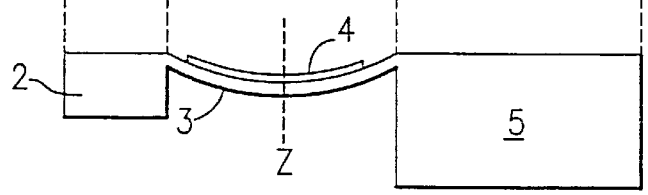
Figure 1C:
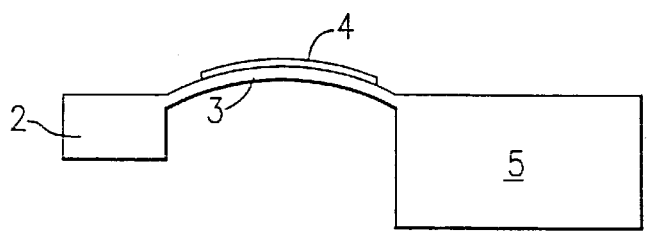
Figure 1D:
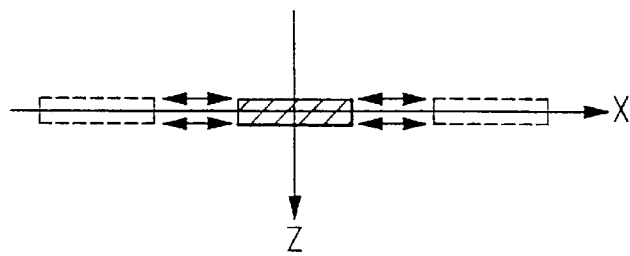
Figure 1E:
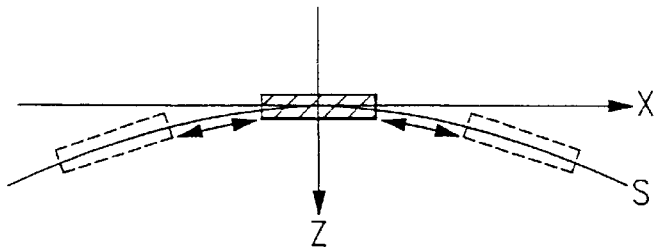

On one surface of the diaphragm 3, a piezoelectric element 4 is arranged, and the diaphragm 3 is convexly curved toward a direction perpendicular to two directions forming the cross (a direction perpendicular to the drawing, which is denoted as "Z-axis direction", and X-Y-Z axes are similarly defined). Consequently, the piezoelectric element 4 also has a curved shape. FIGS. 1B and 1C show sectional views of the state, and these drawings are sectional views of a plane along the X-axis in the plan view of FIG. 1A and perpendicular to a X-Y plane, namely a section of the device 31 in Z-X plane, seen from the Y-axis direction, a direction denoted by an arrow A. A sectional view shown in this method is hereinafter expressed as a "cross-sectional view along a line A—A in the X-axis". Meanwhile, on the piezoelectric element 4, although an electrode lead is arranged from an electrode forming the piezoelectric element 4 toward the substrate 5, the electrode lead is omitted in respective drawings of FIG. 1.

It is preferable that respective members of the connecting plate 2, the diaphragm 3, and the substrate 5 are suitably joined to sides of respective members, and are integrally formed. By use of the green sheet laminating method to be described later, the integrally formed device 31 can be easily obtained. Although the connecting plate 2 is formed with thickness thicker than that of the diaphragm 3, the connecting plate 2 may be formed in the thickness of the same order as the diaphragm. The connecting plate 2 in the device 31 is equivalent to the thin plate 16 in a device 34, to be described later, joined with a spring plate 17 of the same width as the thin plate 16, and by the connecting plate 2 thicker than the diaphragm 3 in a predetermined range, the mechanical strength of the connecting plate 2 can be raised and a displacement of the connecting plate 2 toward the Z-axis, to be described later, can be suppressed.

Here, a connecting plate means an element for transmitting a displacement or vibrations of a diaphragm caused by driving a piezoelectric element, and for enlarging the displacement of the diaphragm, and at the tip or the like of the connecting plate, as shown in a device 34 or the like to be described later, a variety of elements such as a fixing plate, a magnetic head, or the like can be mounted. In other words, the connecting plate performs a function to connect a fixing plate or the like with a substrate, and displace the fixing portion or the like, and in the device 31, the connecting plate 2 per se can be regarded also as functioning as a fixing plate.

A diaphragm means an element for converting a distortion of a piezoelectric element arranged on the surface thereof into a displacement in the bending mode or vibrations, and for transmitting the displacement or the vibrations to a connecting plate. Meanwhile, contrarily, the diaphragm also performs a function of transmitting a distortion or vibrations caused when the connecting plate or a fixing plate or the like joined with the connecting plate is displaced or vibrated to the piezoelectric element. A substrate means an element for holding a movable portion (when a connecting plate, a diaphragm, a piezoelectric element, and a fixing plate or the like is arranged, including the fixing plate or the like), for arranging a variety of electrode terminals for mounting on a measurement apparatus, and for being rendered for handling in actual use.

Although the substrate 5 has formed thereon orthogonally crossing two sides for straddling a diaphragm 3, as described previously, the two sides are not necessarily orthogonally crossed, and a crossing portion of the two sides may also have curvature. Further, the two sides may also be a bottom surface and one side of a recess portion formed on the substrate 5, and further the recess portion may be three sides out of four sides when a quadrangular hole is formed on the substrate. Consequently, the recess portion is not required to be a recess having a side perpendicular to the bottom surface, and also not required to be faced toward one direction.

Figure 2A:
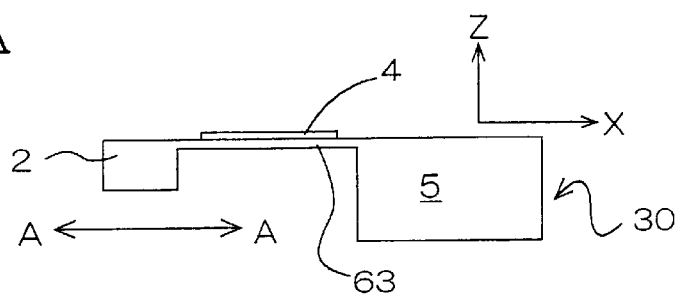
FIGS. 2A, 2B, and 2C show explanatory views of a driving form of a piezoelectric/electrostrictive device of the present invention.
Figure 2B:
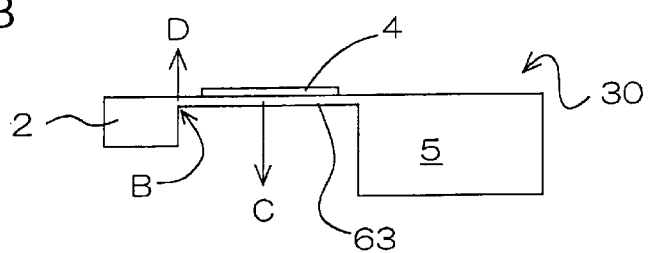
Figure 2C:
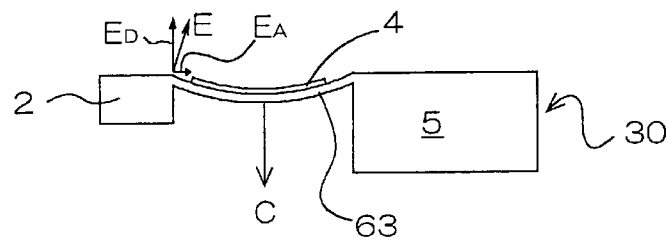

In order to explain a feature of the device 31, firstly by illustrating in FIGS. 2A, to 2C a sectional view of the device 30 thereof having a diaphragm 63 in a parallel plane shape, which corresponds to the sectional view shown in FIG. 1B, instead of a curved diaphragm 3 in the device 31, a displacement mechanism in the device 30 is described. A case is considered, as shown in FIG. 2A, when a tip of the connecting plate 2 is displaced or vibrated in the X-axis direction as shown by an arrow A (hereunder, this aspect is also expressed as "drive").

Figure 5:
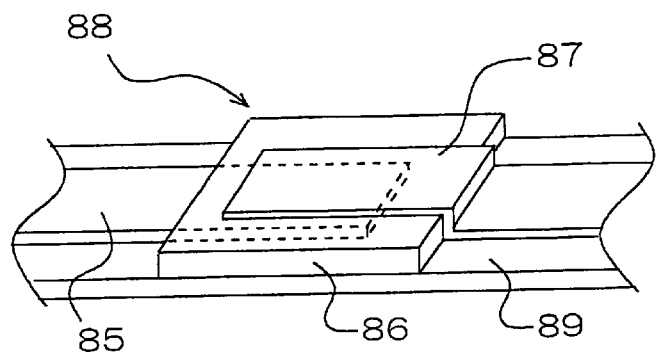
FIG. 5 shows a squint view of an embodiment of a piezoelectric element arranged on a piezoelectric/electrostrictive device of the present invention.

In a case where a piezoelectric element 4 uses $d_{31}$ of a piezoelectric film, for example, as a piezoelectric element 88 as shown in FIG. 5 to be described later, if a voltage is applied to the piezoelectric element 4, an electric field induced distortion is caused in the piezoelectric film, and a displacement in the bending mode is caused in a direction perpendicular to the main plane of the diaphragm 63 denoted by an arrow C (FIG. 2B). At this time, a force denoted by an arrow D in opposite direction of an arrow C is exerted on the joint B of the diaphragm 63 with the connecting plate 2. The direction of the arrow D is the Z-axis direction, which orthogonally crosses the direction of the arrow A, thus a component to displace the connecting plate in the direction of the arrow A is not contained, and therefore the connecting plate 2 is not displaced toward the direction of the arrow A at the moment when a voltage is applied.

However, if a bend is caused to the diaphragm 63, a force acting on the joint B is directed toward a direction as denoted by an arrow E instead of the direction denoted by the arrow D, and a component in the direction denoted by the arrow A (denoted by an arrow $E_A$) is caused. The inventors assumes that the connecting plate 2 would displace in a direction denoted by the arrow A by the displacement component denoted by the arrow $E_A$, and arrives at the device 31 (FIG. 1B), wherein, in order to have the connecting plate 2 advantageously displaced in the direction of the arrow A at a voltage lower than the case where the diaphragm is in a parallel planar shape, in a state prior to applying a voltage across the piezoelectric element 4, shapes of the diaphragm and piezoelectric element (a portion combined these together is hereinafter referred to as "piezoelectric operating portion") are made curved in the similar manner as the one shown in FIG. 2C.

In other words, by forming a curved piezoelectric operating portion, as the device 31 having a sectional shape as shown in FIG. 1B, a force in the direction of the arrow A can be exerted on the joint B from the moment when a voltage is applied across the piezoelectric element 4, thus the connecting plate 2 can be made to more efficiently displace in a larger magnitude relative to the drive of the piezoelectric element 4 at a lower voltage, in comparison to the case where the piezoelectric operating portion is in a parallel planar shape.

Figure 3A:
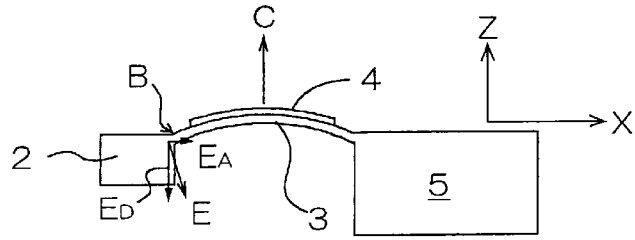
FIGS. 3A and 3B show explanatory views of another driving form of a piezoelectric/electrostrictive device of the present invention.
Figure 3B:
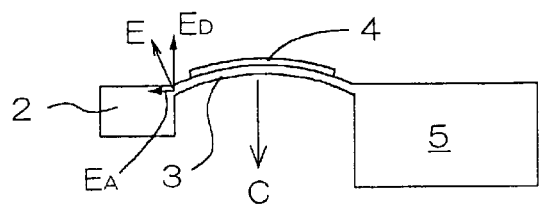
Figure 6:
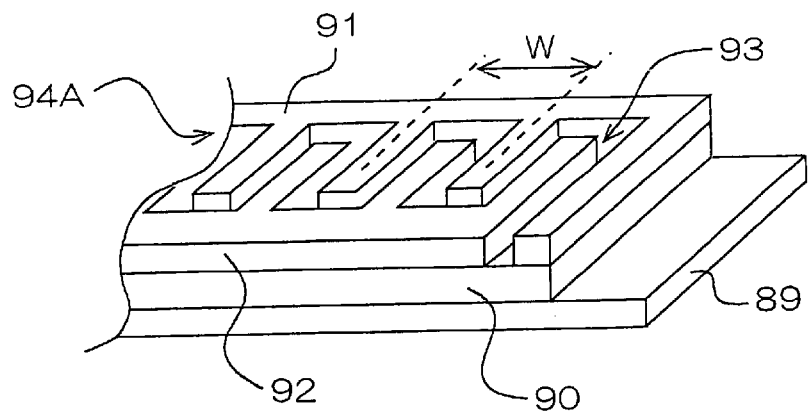
FIG. 6 shows a squint view of another embodiment of a piezoelectric element arranged on a piezoelectric/electrostrictive device of the present invention.
Figure 7:
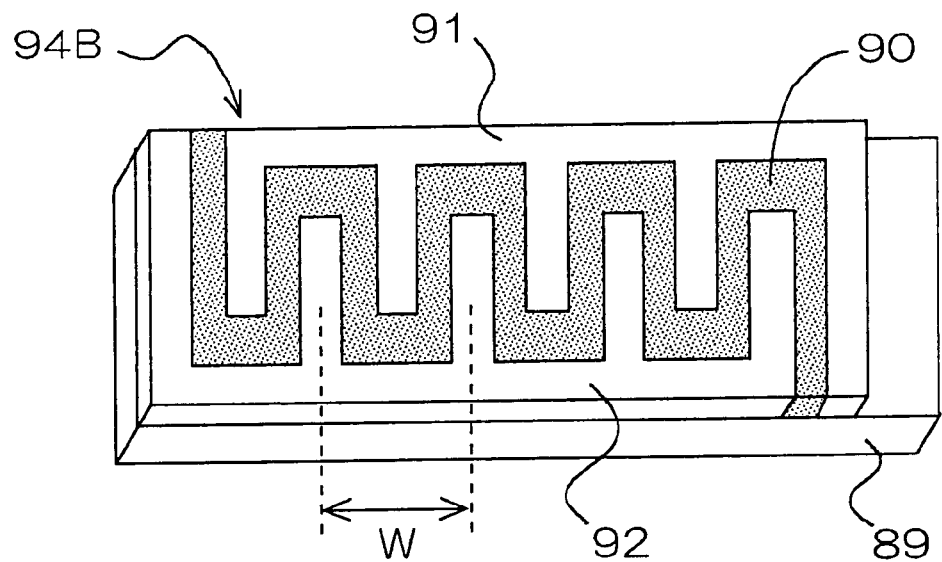
FIG. 7 shows a squint view of still another embodiment of a piezoelectric element arranged on a piezoelectric/electrostrictive device of the present invention.

A direction of the curvature of a piezoelectric operating portion is not necessarily limited to be set so as to have a convex on the side of the diaphragm 3 as shown in FIG. 1B. In other words, as shown in FIG. 1C, it is possible to make in a shape having the convex on the side of the piezoelectric element 4. Sectional views shown in FIGS. 3A and 3B are explanatory views of a displacement mechanism of a piezoelectric operating portion when having such a structure. In a case where the piezoelectric element 4 is used where $d_{33}$ is utilized such as piezoelectric elements 94A and 94B as shown in FIG. 6 or FIG. 7 to be described later, as a piezoelectric film is extended toward an electric field, namely in a direction of the main surface of the piezoelectric film, as shown in FIG. 3A, by a voltage applied across a piezoelectric film 4, the piezoelectric operating portion is caused to have a bending displacement in a direction denoted by the arrow C where the convex is sharper. By this, a force toward an arrow E is exerted on the joint B, and by the X-axis component thereof denoted by the arrow $E_A$, the connecting plate 2 is made to displace toward the arrow A.

On the other hand, in FIG. 3B, when a piezoelectric element 4 utilizing $d_{31}$ such as a piezoelectric element 88 shown in FIG. 5 to be described later in the similar manner as described previously, a piezoelectric film is transformed so as to expand and contract in a direction perpendicular to a electric field, namely in the main surface direction of the piezoelectric film, thus the piezoelectric operation portion is displaced in the direction denoted by the arrow C so as to have the convex shape gradually becoming to be horizontal. By this, a force toward the arrow E is exerted on the joint B, and by the X-axis component denoted by the arrow $E_A$, the connecting plate 2 is made to displace in the direction of the arrow A. However, in this case, the degree of the curvature becomes smaller in correspondence with the displacement of the piezoelectric operating portion, thus the displacement efficiency of the connecting plate 2 in the direction of the arrow A also becomes slightly smaller.

Figure 4A:
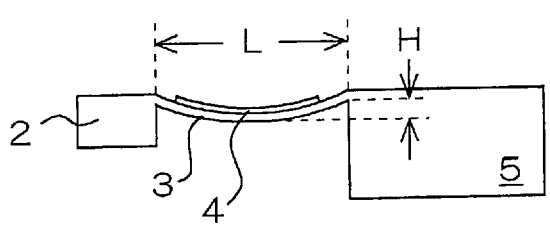
FIGS. 4A and 4B show explanatory views with regard to a shape definition of a diaphragm in a piezoelectric/electrostrictive device of the present invention.
Figure 4B:
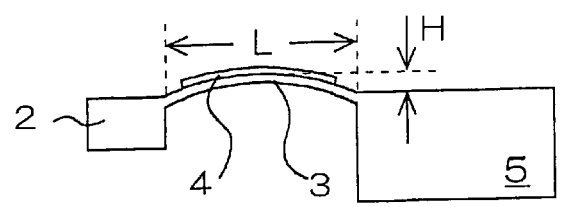

Even if the piezoelectric element 4 is arranged either on the convex surface or on the recess portion surface of the diaphragm 3, it is preferable, as shown in FIGS. 4A and 4B, when the length of the diaphragm 3 in the straddling direction is set to be L, and the height of a curvature in the convex direction is set to be H, that a relation of $1 \leq (H/L) \times 100 \leq 30$ is satisfied, and it is more preferable that a relation of $1 \leq (H/L) \times 100 \leq 10$ is satisfied. As described hereinafter, as the device of the present invention forms the piezoelectric operating portion by the film forming method, the shape of the piezoelectric operating portion is deeply associated with the sintering stress at the time of sintering the piezoelectric film, and therefore it is preferable to suppress the deterioration of the piezoelectric properties due to the sintering stress, and the designing is made considering the easiness of fabrication of the device, and by satisfying the above-described mathematical expressions, the deterioration of the piezoelectric properties due to the sintering stress can be suppressed to be small and to be within a range to make the displacement efficiency well utilized. Meanwhile, the convex shape is satisfied at least in the straddling direction of the diaphragm 3, and the direction orthogonally crossing the straddling direction of the diaphragm 3 does not necessarily limited in the category.

As described previously, in order to have a predetermined displacement caused to the connecting plate 2, a variety of piezoelectric elements 4 utilizing $d_{31}$ or $d_{33}$ are arranged on the device 31. As a configuration of the piezoelectric element 4 utilizing $d_{31}$, representative is the piezoelectric element 88 where a piezoelectric film 86 is formed in layers interposed by a first electrode 85 and a second electrode 87 on the diaphragm 89, as described previously, and as shown in FIG. 5. On the other hand, as a configuration of the piezoelectric element 4 utilizing $d_{33}$, there is a piezoelectric element 94A with a comb-shaped structure, where a piezoelectric film 90 is arranged on a diaphragm 89, where a gap 93 of a fixed width is formed a first electrode 91 and a second electrode 92 on the piezoelectric film 90 as shown in FIG. 6. Further, the first electrode 91 and the second electrode 92 in FIG. 6 may be formed on a connecting plane between the diaphragm 89 and the piezoelectric film 90. Further, as shown in FIG. 7, a piezoelectric element 94B having the piezoelectric film 90 so as to be buried between the first electrode 91 and the second electrode both being of comb-shaped is preferably used as a piezoelectric element utilizing $d_{33}$.

When using piezoelectric elements 94A and 94B having comb-shaped electrodes as shown in FIG. 6 and FIG. 7, a displacement can be made larger by reducing a pitch W in the comb-shaped electrodes. Such piezoelectric elements as described in FIG. 5, FIG. 6, and FIG. 7 can be applied to all devices of the present invention to be described hereinafter. When a voltage is applied across such piezoelectric element 4, a distortion is generated on a piezoelectric film depending on the applied voltage, and the distortion is transmitted to a diaphragm 3, and then transmitted to a connecting plate 2, thus a predetermined displacement is generated on the connecting plate 2.

Now, a shape of a displacement of a connecting plate 2, namely the displacement mode is described. When a joined plane of a connecting plate 2 with a substrate 5 is made as a fixed plane, and the central axis (Y-axis) perpendicularly penetrating through the center of the fixed plane, as shown in FIG. 1, is considered, it is preferable to use at least any one of displacement modes of the θ displacement mode wherein a connecting plate 2 swingably displaces in the joining direction (X-axis direction) of the connecting plate 2 with a diaphragm 3, the φ displacement mode wherein a displacement component in a direction (Z-axis direction) perpendicular to both directions of the joining direction (X-axis direction) of the connecting plate 2 with the diaphragm 3 and the extending direction (Y-axis direction) of the central axis is added to this θ displacement mode as away from the Y-axis, the ν displacement mode wherein the displacement is performed uniaxially in the joining direction (X-axis direction) of the connecting plate 2 with the diaphragm 3, or the νz displacement mode wherein a displacement component in a direction (Z-axis direction) perpendicular to both directions of the joining direction (X-axis direction)of the connecting plate 2 with the diaphragm 3 and the extending direction (Y-axis direction) of the central axis is added to the ν displacement mode as away from the Y-axis.

Namely, the θ displacement mode is a displacement mainly containing displacement components in the X-axis direction and the Y-axis direction, while the φ displacement mode contains displacement components in three axes directions of X, Y, and Z. The ν displacement mode is a displacement mainly containing displacement components in the X-axis direction and the νz displacement mode is a displacement mainly containing displacement components in the the X-axis direction and the Z-axis direction. By suitably changing the shape of a connecting plate, and the design of the arrangement of the position of a diaphragm, or the like, it is possible to determine which displacement mode is made to be dominant. Further, these displacement modes mainly contain components in the directions described above, however, this does not mean that they do not contain any other displacement directional components at all.

As described previously, the device of the present invention is possible to generate a variety of displacements depending on the arrangement positions and the driving modes of a piezoelectric element 4. In the device 31, while a piezoelectric element 4 is arranged only on one surface of a diaphragm 3, a piezoelectric element may be arranged on the other surface. For example, it is possible to drive a device by arranging a piezoelectric element utilizing $d_{31}$ on a concave surface of a diaphragm, and a piezoelectric element utilizing $d_{33}$ on a convex surface of the diaphragm.

Further, when a piezoelectric element is arranged respectively on both surfaces, one piezoelectric element is used as a driving element of a connecting plate as described previously, and the other piezoelectric element may be used as an auxiliary element. Here, the auxiliary element is a trouble diagnosing element, a displacement confirming/judging element, a driving assisting element, or the like, and by use of an auxiliary element, driving of a connecting plate in high precision is made possible.

Figure 8:
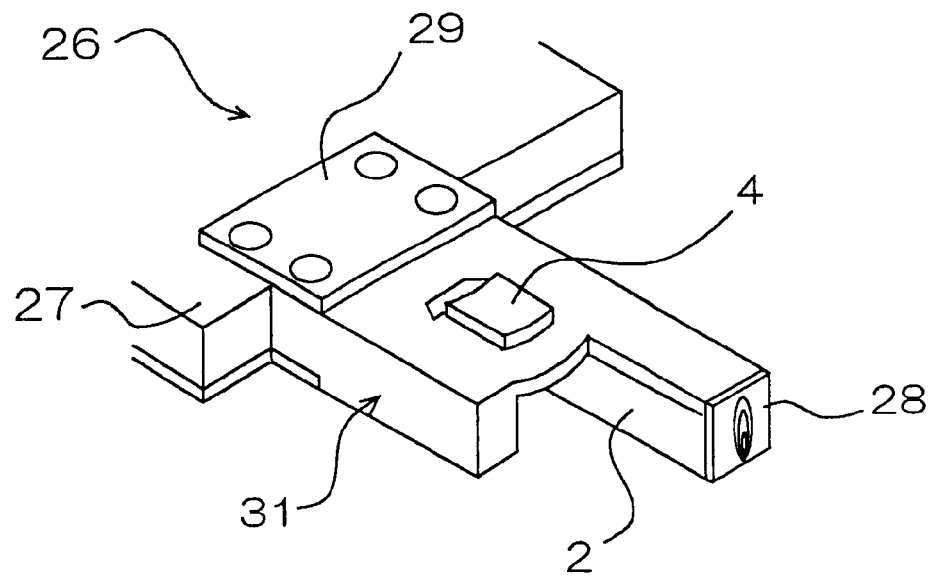
FIG. 8 shows a squint view illustrating an example of an actuator using a piezoelectric/electrostrictive device of the present invention.

FIG. 8 shows a squint view of an example of an actuator 26 using the device 31. The device 31 is firmly fixed on a member such as a slider 27 or the like by use of fixing jigs 29 or the like. At the tip of a connecting plate 2 of the device 31, a magnetic head 28 is mounted, and by driving a piezoelectric element 4, the magnetic head can be moved as much as a predetermined displacement quantity. Further, members to be fixed such as a slider 27 or the like and the device 31 can be made into an integrated configuration of each members without using fixing jigs 29, as to be described later, by machining a green sheet.

Now, FIGS. 9A and 9C show plan views of devices 32A and 32B of another embodiment of the present invention, and FIG. 9B and FIG. 9D show cross-sectional views along a line A—A in the X-1 axis in the plan views. A connecting plate 2 of the device 32A, is formed by a thin portion 6 and a thick portion 7 wherein the outer periphery made thicker than the central portion. In other words, the device 32A is equivalent to the device 31 wherein the central portion of a connecting plate 2 thereof of a fixed thickness is scraped off to form a thin portion 6, and can be easily obtained by sticked C-shaped spring plate 8 on a planar surface of a thin plate having thickness equivalent to a diaphragm 3. The device 32A is made possible to efficiently obtain a planar displacement because lightening the weight per se strongly resistive to twisting, thus improvement in positioning speed (improvement in controllability of displacement quantity), improvement in precision of displacement (movement) path, or the like can be planned.

Further, the device 32B is formed with a slit (space) on the thin portion 6 of the device 32A, thereby displacement quantity can be increased. Further, while the slit 9 is a long window along the Y-axis, similar effect can be obtained if a hole, (window) of circular or the like, is formed instead of the slit 9.

FIG. 10 shows a plan view of still another embodiment of a device of the present invention. Although, in the devices 31, 32A, and 32B, described previously, a substrate 5 is not joined with a diaphragm 3, in the Y-axis direction, and a window 15 is formed, in a device 33, the diaphragm 3 is inserted with a bottom of a recess portion 10 formed by the substrate 5 and a connecting plate 2 lest the window 15 should be formed. In other words, the diaphragm 3 is thereof two sides joined with the substrate 5, and thereof one side joined with the connecting plate 2. In the present invention, the arrangement mode where the diaphragm 3 is "inserted" in this way is made as one mode of the arrangement modes where the diaphragm 3 is "straddled" in the device 31 or the like. By structuring in this way, bending of the connecting plate 2 in the Z-axis direction can be suppressed, and the θ displacement mode can be made more likely to be generated, and by making the form of the connecting plate 2 to be similar to the device 32A described previously, the v displacement mode can also be made to be more likely to be generated.

FIG. 11A shows a plan view of a device 34 with a fixing plate 1 joined at the tip of a connecting plate 2, FIG. 11B shows a sectional view along a line A—A in the X-axis in the plan view, and FIGS. 11C to 11F show sectional views along a line B—B in the Y-axis in the plan view of sectional views of a variety of different forms. Here, a fixing plate performs a function to facilitate fixing of other elements or members which are hard to be directly fixed to a connecting plate.

Although, a connecting plate 2 of the device 34 is planned to improve the mechanical strength thereof by making thicker structure the center thereof, contrary to the device 32A, a great feature of the device 34 is not the connecting plate 2 per se, but the structure of the joint of the substrate 5 with the connecting plate 2. Namely, if the connecting plate 2 of the previously described device 31 is regarded as structured by a thin plate 16 and a spring plate 17 as illustrated in FIG. 11F, a diaphragm 3 is structured by being joined with the thin plate 16, a twist about the Y-axis as the axis of rotation is likely to be generated by an action of a force from a diaphragm 3.

Contrarily, as shown in FIGS. 11C, 11D, and 11E, when the connecting plate 2 of the device 34 comprises the thin plate 16 and the spring plates 17 joined on the both surfaces thereof, the diaphragm 3 is made to be structured by being joined with a part of the thin plate 16, a force from the diaphragm 3 is made to be exerted to the center in the Z-axis direction of the connecting plate 2. By this way, the rotational displacement about the Y-axis is suppressed, thus the displacement in the X-axis can be made dominant, facilitating the fixing plate 1 to displace in the θ mode, and the device 34 is made better suited for use applications for a magnetic head and the like. Further, rigidity of the device can be raised and the responsibility at high speed can also be effectively improved.

In order to effectively generate such displacement of a connecting plate 2, it is preferable that the entirety of the connecting plate 2 is joined with a substrate 5. Namely, as shown in FIGS. 11C and 11D, it is preferable to have a state where the entirety of the connecting plate 2 is joined with the substrate 5, irrespective of the position in the Z-axis direction. Contrarily, as shown in FIG. 11E, when one spring plate 17 is not directly joined with the substrate 5, it is preferable to form a spring plate reinforcing plate 18 so as to have the spring plate 17 joined with the substrate 5.

Further it is preferable that the spring plate 17 is constituted to be symmetrical to the thin plate 16, when a material of the spring plate 17 is made different for respective surfaces of the thin plate 16, the spring plate 17 is unrequired to be in the same shape, and a shape may be preferably set in a suitable shape considering the Young's modulus and the like of the spring plate 17.

Now, in the device 34, a piezoelectric element 4 is split in the Y-axis direction and formed as piezoelectric elements 4A and 4B. In this case, the piezoelectric element 4A on the side of the fixing plate 1 can be used as a driving element, and the piezoelectric element 4B on the side of the joint of the connecting plate 2 with the substrate 5 can be used as an auxiliary element. It goes without saying that the splitting formation and method of use of the piezoelectric element can be applicable to all devices of the present invention, and when a plurality of piezoelectric elements are arranged, it is also preferable that further an optional number of piezoelectric elements are split to be used.

In such case, auxiliary elements of different applications can be facilitated to be arranged on one device. Further, a piezoelectric element can be split by either of the methods; split-machining by use of the laser machining after one piezoelectric element being arranged, as to be described later, or arranging a set of two elements from the beginning when arranging a piezoelectric element.

Now, FIG. 12 shows a plan view of a device 35 having a structure where a fixing plate 1 is joined on the device 33, a connecting plate 2 and a fixing plate 1 are alternately joined to make a meandering form, and a diaphragm 3 having a piezoelectric element 4 arranged thereon is inserted with a recess portion 10 formed by a connecting plate 2 and a fixing plate 1 which are in neighboring positions.

Here, it is preferable that the fixing plate 1 is to be thicker member than the diaphragm 3. By having such structure, rigidity of the fixing plate 1 is high, and distortion generated when the piezoelectric element 4 is driven is small on the side of fixing plate 1 and larger on the opposite side. If a planar form of a portion comprising neighboring two connecting plates 2 and a fixing plate 1 joining these connecting plates 2 together is assumed to be a V-shape, the connecting plates 2 are made to generate a large displacement as if to open a mouth having the top of the V-shape as the fixed point. Contrarily, when the fixing plate 1 is thin, the connecting plates 2 becomes unlikely to be displaced by the distortion of the fixing plate 1, thus it is difficult to obtain a large displacement. With the device 35, larger displacement quantity is made obtainable, as displacements in the V-shape of a plurality of connecting plates 2 are composed.

Further, in the device 35, it is also preferable to have the diaphragm 3, not joined with the fixing plate 1, but provided with a window, and straddled between the neighboring connecting plates 2. In this case, even if a fixing plate 1 is not necessarily formed to be thick, an above-described V-shaped displacement of a connecting plate 2 is made obtainable.

Figure 13A:
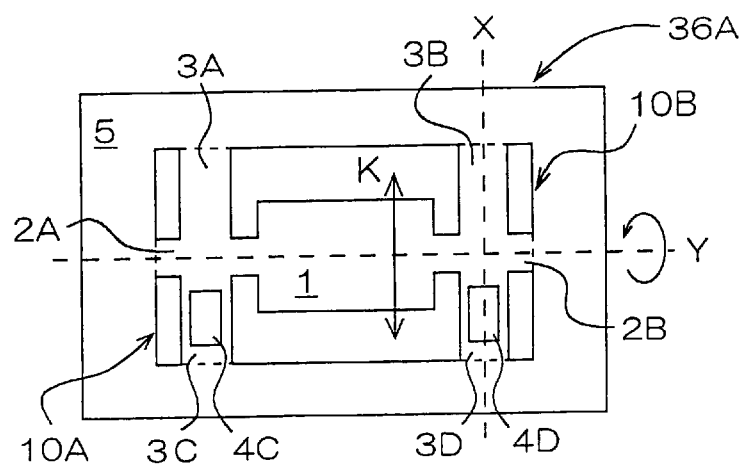
FIGS. 13A, 13B, and 13C show plan views of still another embodiment of a piezoelectric/electrostrictive device of the present invention.
Figure 13B:
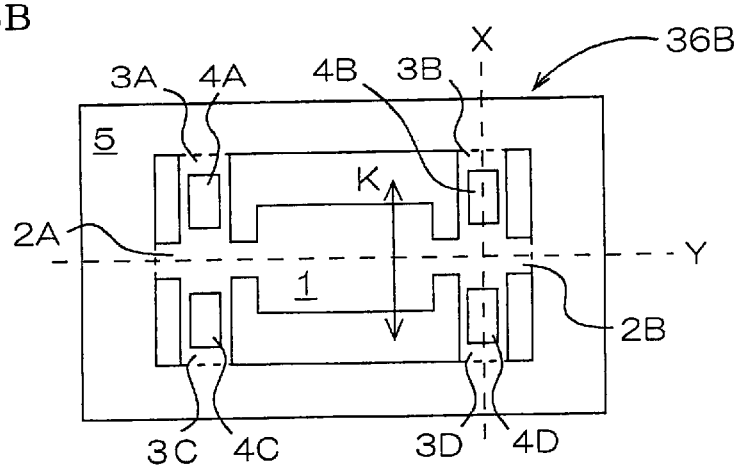
Figure 13C:
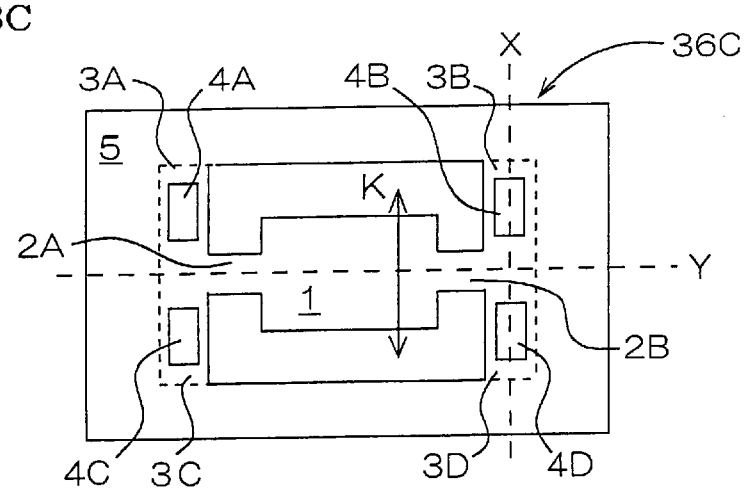

Now, FIGS. 13A, to 13C show plan views of a variety of embodiments of a second piezoelectric/electrostrictive device of the present invention. Firstly, a device 36A shown in FIG. 13A is described. The device 36A is structured such that a fixing plate 1, connecting plates 2A and 2B, and diaphragms 3A to 3D are mutually joined together so as to have a direction in which the fixing plate 1 is interposed by the connecting plates 2A and 2B (Y-axis direction) and a direction in which connecting plates 2A and 2B are interposed by the diaphragms (3A and 3C) and (3B and 3D) (X-axis direction) are mutually intersected to form a cross, namely orthogonally crossed, the connecting plates 2A and 2B are joined with bottom surfaces of opposite recess portions 10A and 10B formed on the substrate 5, and the diaphragms 3A to 3D are joined with the sides of the recess portions 10A and 10B.

In the device 36A, although piezoelectric elements 4C and 4D are formed only on the diaphragms 3C and 3D, the arrangement and the driving mode of the piezoelectric elements can be changed similar to a device 36B to be described later. Although the diaphragms 3C and 3D having the piezoelectric elements 4C and 4D arranged thereon are curved to be a convex toward one of the Z-axis direction, the diaphragms 3A and 3B without piezoelectric elements arranged thereon are not necessarily to be curved.

In the device 36A, rotation about the Y-axis of the fixing plate 1 is suppressed by the diaphragms 3A to 3D. Therefore, the device 36A has a feature that, when the piezoelectric elements 4C and 4D are simultaneously driven in the same phase, the fixing plate 1 becomes likely to be displaced in the X-axis direction on the X-Y plane, as denoted by an arrow K in FIGS. 13A. Such displacement mode in the device 36A is called the uniaxial displacement mode.

A device 36B is a modification of FIG. 13A having all diaphragms 3A to 3D made in a curved shape, and piezoelectric elements 4A to 4D arranged thereon. By making use of these as driving elements, displacement quantity of a fixing plate 1 in a direction denoted by the arrow K can be increased. In this case, it is preferable to have piezoelectric elements 4A and 4B to be a set, and piezoelectric elements 4C and 4D to be another set, to have respective sets simultaneously driven in opposite phases, however, a displacement in the direction denoted by the arrow K can be obtained, even driven mutually in the same phase, by applying voltages with shifted time. The piezoelectric elements 4A to 4D may be provided on both surfaces of diaphragms 3A to 3D, and it is also preferable that, for example, a piezoelectric element arranged on a recess portion side can be used as a driving element, and a piezoelectric element arranged on a convex side can be used as an auxiliary element.

It should be noted that the same phase/opposite phase relative to the drive of a piezoelectric element is to determine the direction of distortion of a piezoelectric element to be generated, and the same phase means to drive a piezoelectric element to generate distortion in the same direction, and the opposite phase means to drive a piezoelectric element to generate distortion in the opposite direction, or not to drive one piezoelectric element without applying a signal, namely to drive to generate distortion in relatively opposite direction. For example, when a voltage is applied a set of piezoelectric elements, a case where distortion of contraction or distortion of extension is generated in respective planes, it is called the same phase, while distortion of contraction is generated in the one of the piezoelectric elements and distortion of extension is generated in the other of the piezoelectric elements, it is called the opposite phase. Accordingly, it is possible to compose a group of piezoelectric elements, by suitably combining those utilizing the lateral effect ($d_{31}$) of the electric field induced distortion and those utilizing the longitudinal effect ($d_{33}$) of the electric field induced distortion. If a piezoelectric element is composed of a piezoelectric material requiring the polarization operation, even if the material utilizes all $d_{33}$ or $d_{31}$, the phase can be controlled by setting a signal of the time of driving to be in the same direction or in the opposite direction with the polarity at the time of polarization.

A device 36C has diaphragms 3A to 3D joined with the sides of the bottoms of recess portions 10A and 10B on a substrate 5, in other words, the device 36C is applied by the arrangement form of a diaphragm 3 in the device 33 shown in FIG. 10. In this way, bending and deflection in the Z-axis direction of connecting plates 2A and 2B and a fixing plate 1 can be suppressed, thus a more genuine displacement in the direction denoted by the arrow K is made obtainable.

Figure 14A:
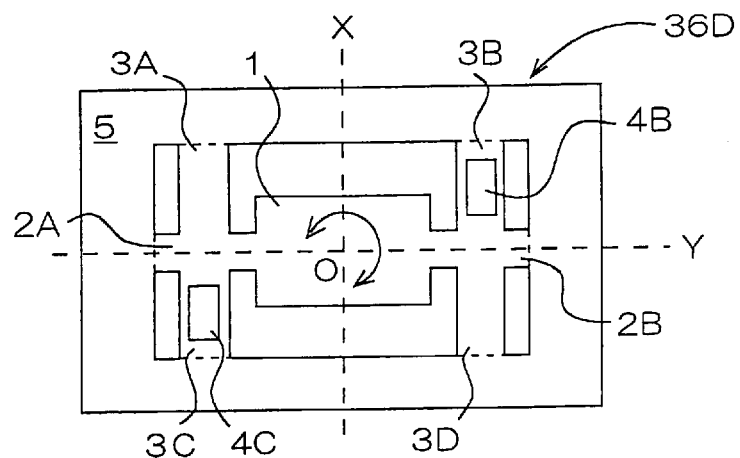
FIGS. 14A, 14B, and 14C show plan views of still another embodiment of a piezoelectric/electrostrictive device of the present invention.
Figure 14B:
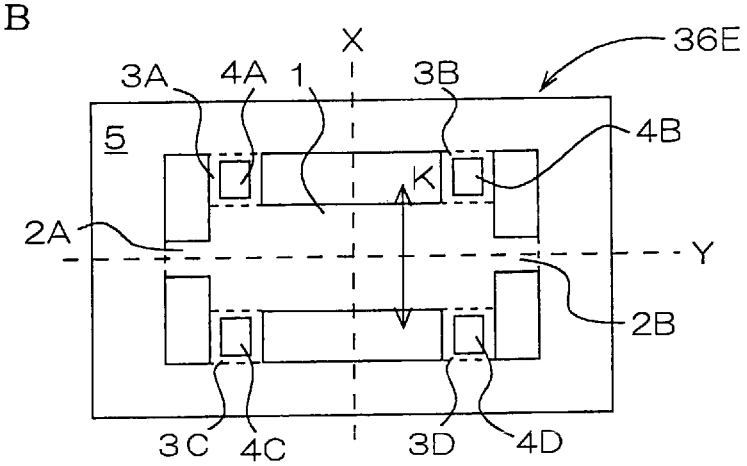
Figure 14C:
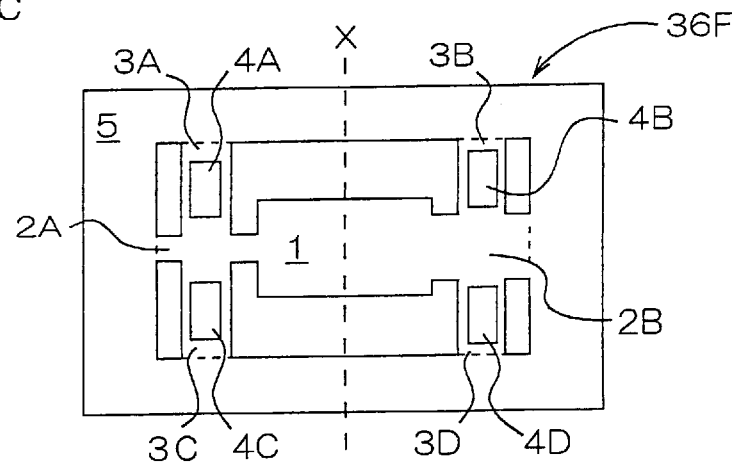

Next, FIGS. 14A to 14C are plan view of devices 36D to 36F respectively having a structure similar to the device 36A. The device 36D has piezoelectric elements 4B and 4C arranged on diaphragms 3B and 3C positioned diagonally relative to the center O of a fixing plate 1. Here, if the piezoelectric elements 4B and 4C are driven in the same phase, an in-plane rotational displacement in the X-Y plane as the center about the center O as denoted by an arrow in FIG. 14A is caused on the fixing plate 1. When such fixing plate 1 is driven in the rotational displacement mode, diaphragms 3A and 3D are not necessarily formed. On the other hand, if piezoelectric elements 4A and 4D are respectively arranged on the diaphragm 3A and 3D, and the piezoelectric elements 4A and 4D are simultaneously driven so as to be in opposite phase to the piezoelectric elements 4B and 4C, they can be driven in the rotational displacement mode displaying a larger displacement. Additionally, it can naturally be understood that, even if the piezoelectric elements 4A and 4D and the piezoelectric elements 4B and 4C are in the same phase, a displacement in double strokes, when measured in the number of strokes, can be obtained, in comparison with the case of only with the piezoelectric elements 4B and 4C, if drive with a voltage applied with shifted timing. It goes also without saying that such method of driving a piezoelectric element can be applicable to all devices having a plurality of piezoelectric elements arranged thereon.

A device 36E shows a form where diaphragms 3A to 3D are directly joined to a fixing plate 1, and the arrangement state of piezoelectric elements 4A to 4D is similar to the case shown in FIG. 13B. With this structure, the fixing plate 1 can also be efficiently displaced by the uniaxial displacement mode in the direction denoted by the arrow K. Further, if the arrangement form of the piezoelectric elements of the device 36D is applied to the device 36E, the fixing plate 1 can also be driven in the rotational displacement mode.

A device 36F shows an embodiment with the width (width in the X-axis direction) of one side of connecting plates 2A and 2B made wider, and the width of the other side thereof made narrower, and in this case, a fixing plate 1 is facilitated to be driven in the θ displacement mode or the φ displacement mode. In a case where a displacement is obtained by use of a plurality of piezoelectric elements, as is the case with the devices 36A to 36F, or devices 37 to 44 to be described later, in order to make a predetermined directional component to be dominant and to gain displacement quantity in uniformity, it is preferable that variation in the shapes of individual piezoelectric operating portions and the degree of curvature is made smaller.

Now, a variety of shapes of a third device of the present invention are described. FIG. 15A shows a plan view of a device 37, and FIG. 15B shows a sectional view along line A—A in the X-axis in FIG. 15A. In the device 37, a connecting plate 2 has one end thereof in the longitudinal direction (Y-axis direction) being interposed by two diaphragms 3A and 3B, and the other end thereof being interposed by other two diaphragms 3C and 3D, and in the state, is straddled between the bottom surfaces of opposite recess portions 10A and 10B formed on a substrate 5. On respective one surfaces of diaphragms 3A to 3D, piezoelectric elements 4A to 4D are respectively arranged, the diaphragm 3A to 3D are joined to the sides and bottom surfaces of the recess portions 10A and 10B, and a fixing plate 1 joined with the connecting plate 2 such that the longitudinal direction of the fixing plate 1 is made to be a direction where a connecting plate 2 is interposed by the diaphragms 3A to 3D, namely to be the X-axis direction. The diaphragms 3A to 3D are, as shown in FIG. 15B, curved to form a convex toward one direction of the Z-axis directions.

Further, a recess portion means a site having one side of a bottom surface and two sides of the side. For example, when a recess portion is formed by notching a part of the outer periphery of a substrate into a quadrangular shape and a quadrangular hole is provided inside the substrate, three sides out of four sides can be regarded as a recess portion. An angle formed by a side surface and a bottom surface in a recess portion may have a gradient within a range where the driving properties of the device of the present invention is obtainable. Formation of such a recess portion is applicable to the devices 31 to 36F described previously and devices to be described later.

Out of methods for driving the device 37, one method is that, preferably as shown in FIG. 15B, when the piezoelectric elements 4A to 4D are arranged on the surfaces curved in the same direction of the diaphragms 3A to 3D, one set of piezoelectric elements 4A and 4D positioned mutually in diagonal position are driven in the same phase about the joint of the fixing portion 1 with the connecting portion, namely about the intersection point of the X-axis with the Y-axis, as the center, and the other set of piezoelectric elements 4B and 4C are simultaneously driven in the opposite phase relative to the piezoelectric elements 4A and 4D. In this case, when the piezoelectric elements 4A and 4D is extended, the piezoelectric elements 4B and 4C are contracted, and as the state is developed as displacements of the diaphragms 3A to 3D having the piezoelectric elements 4A to 4D arranged thereon, an in-plane rotational displacement (the in-plane rotational displacement mode) about the intersecting point of the X-axis with the Y-axis in the X-Y plane as the center is generated on the fixing plate 1, as shown by an arrow K1 in FIG. 15.

On the other hand, another method of driving the device 37 is given where one set of piezoelectric elements 4A and 4C, positioned mutually in axial symmetry preferably having the X-axis which is the longitudinal axis of the fixing plate 1 as the symmetry axis, is driven in the same phase, and the other set of piezoelectric elements 4B and 4D are simultaneously driven in the opposite phase. In this case, the uniaxial directional displacement (the uniaxial directional displacement mode) in the X-Y plane, as shown by an arrow K2 in FIG. 15, is obtained. Also as described in relation to the method of driving the device 36D, the displacement in the direction of the arrow K1 or the arrow K2 is, of course, obtainable also by driving respective sets of piezoelectric elements in the same phase with shifted time, even if a set of the piezoelectric elements is not driven simultaneously in the opposite phase, which, however, is inferior when compared with the case when simultaneously driven in the opposite phase, from the view point of the magnitude of the displacement.

In this manner, in the device 37, by variously selecting the length of a connecting plate 2 and the length of a fixing plate 1, it becomes possible to optionally set the response speed, the displacement quantity at the tip of a fixing plate 1, and the force for generating a displacement. A fixing plate 1 is preferably joined with a connecting plate 2 at the center in the longitudinal direction thereof, and in this case, a displacement can easily be controlled, and the largest magnification ratio of displacement can be obtained, which are preferable. There is no limitation whatsoever about the shape of a fixing plate 1, and the shape of the fixing plate 1 can be set considering shapes, weights, and the like of elements or sensors to be mounted at the tip of the fixing plate 1.

Further, in the device 37, it is unnecessary that all of the diaphragms 3A to 3D and all of the piezoelectric elements 4A to 4D are in the same shape. For example, the lengths of the diaphragms 3A and 3C and the piezoelectric elements 4A and 4C in the X-axis direction are made shorter, while the lengths of the diaphragm 3B and 3D and the piezoelectric elements 4B and 4D in the X-axis direction are set longer, thus the fixing plate 1 is enabled to be driven in the uniaxially directional displacement mode. Similarly, lengths of the diaphragms 3A and 3D and the piezoelectric elements 4A and 4D in the X-axis direction are made shorter, while lengths of the diaphragms 3B and 3C and the piezoelectric elements 4B and 4C are set longer, thus the fixing plate 1 is enabled to be driven in the in-plane rotational displacement mode.

Further, the device 37 is structured to have the diaphragms 3A and 3D without the piezoelectric elements 4A and 4D provided thereon while having a notch parallel to the Y-axis provided thereon, or structured without the diaphragms 3A and 3D provided thereon, and by driving the piezoelectric elements 4B and 4C in the same phase, the fixing plate 1 can be driven in the in-plane rotational displacement mode. In addition, the device 37 is structured to have the diaphragm 3A and 3C without the piezoelectric elements 4A and 4C provided thereon while with a notch parallel to the Y-axis provided thereon, or structured without the diaphragm 3A and 3C, and by driving the piezoelectric elements 4B and 4D in the same phase, the fixing plate 1 can be driven in the uniaxially directional displacement mode. Meanwhile, the piezoelectric elements 4A to 4D may be provided so as to overlap the substrate 5, if unable to overlap the connecting plate 2.

A device 38 shown in FIG. 16 has a shape having a notch 11 at the joint of a fixing plate 1 with a connection plate 2 on the device 37. In this case, the device 38 can convert a displacement of the connecting plate 2 more efficiently in comparison with the device 37 into a displacement of the fixing plate 1 in the in-plane rotational displacement mode.

In other words, the in-plane rotational displacement mode of the fixing plate 1 in the device 37 previously shown in FIG. 15 is generated mainly based on the deflecting displacement in-pane of X-Y plane of the connecting plane 2, and therefore, while it is a displacement mode substantially maintaining the joining angle between the connecting plate 2 and the fixing plate 1, in the case where a notch 11 is provided as the device 38 shown in FIG. 16, it becomes possible for the deflecting displacement of the connecting plate 2, at the joining position of the fixing plate 2 with the fixing plate 1, to be further converted into the rotational displacement in a shape to have the joining angle between the fixing plate 1 and the connecting plate 2 changed, and as the result, the displacement of the fixing plate 1 can be made larger.

Accordingly, whereas the device 37 shown in FIG. 15 is structured to enlarge and to utilize the displacements of the piezoelectric elements 4A to 4D mainly into the deflecting displacement of the connecting plate 2, the device 38 shown in FIG. 16 is structured to have the displacement obtained as a enlarged deflecting displacement of the connecting plate 2 further enlarged to be a rotational displacement, that is to say, structured to effectively utilize two-staged enlargement mechanism. Further, the notch 11 is preferably formed the distance in the width-wise direction namely the distance in the X-axis direction, of the connecting plate 2 to be long enough to reach to the inside of the fixing plate 1, while the width of the notch 11, namely the distance in the Y-axis direction of the notch 11 is preferably shorter.

Figure 17A:
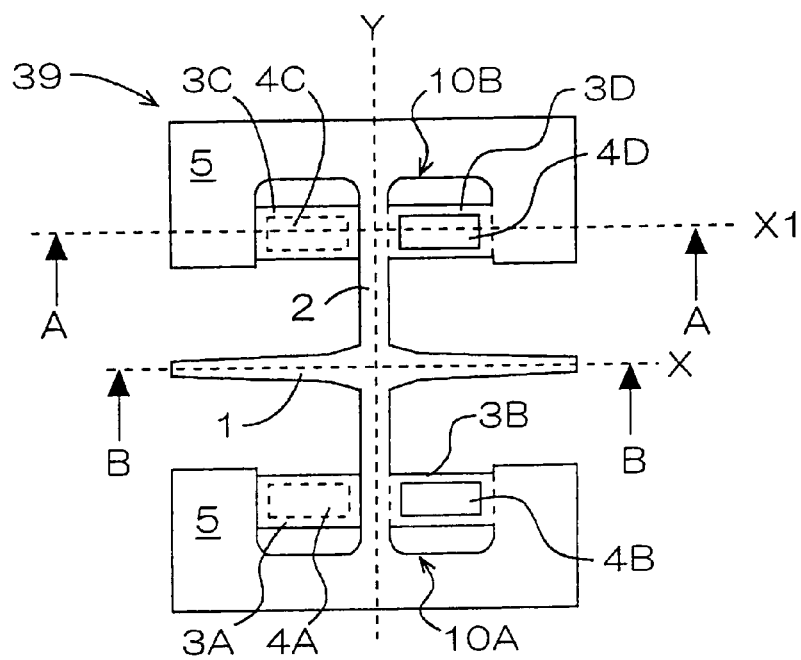
FIG. 17A shows a plan view.

FIG. 17A shows a plan view of still another embodiment of a device of the present invention, and a device 39 shown therein has a structure that diaphragms 3A to 3D are not joined with bottom surfaces of recess portions 10A and 10B formed on a substrate 5, and arranged in a form to be straddled between a connecting plate 2 and sides of the recess portions 10A and 10B, and a fixing plate 1 is formed joined with the connecting plate 2 so as to intersect the connecting plate 2. By providing such structure, both ends of the fixing plate 1 can be displaced in great magnitude and an element and a sensor are enabled to be mounted respectively on the both ends.

Figure 17B:
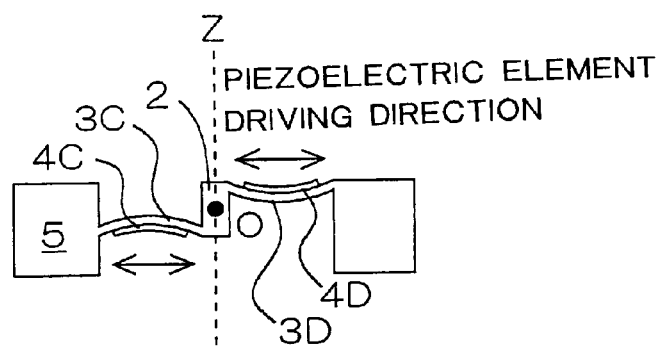
FIG. 17B shows a sectional view.
Figure 17C:
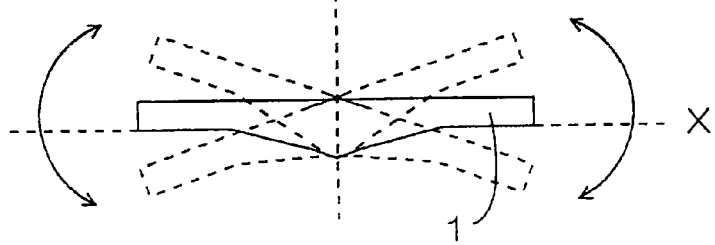
FIG. 17C shows an explanatory view of a driving form of still another embodiment of a piezoelectric/electrostrictive device of the present invention.

FIG. 17B is a sectional view along a line A—A in the X1-axis in FIG. 17A. Here, a pair of diaphragms (diaphragm 3C and 3D) interposing the connecting plate 2 are respectively joined with the connecting plate 2 at a position shifted toward the thickness direction (Z-axis direction) of the connecting plate 2. In this case, if piezoelectric elements 4C and 4D are arranged on one respective planar surfaces of the diaphragms 3C and 3D, about the middle point O of the joined position of a pair of diaphragms (diaphragm 3C and 3D) interposing the connecting plate 2 with the connecting plate 2 as the center of point symmetry, and the piezoelectric elements 4C and 4D are driven in the same phase, a rotational displacement using the longitudinal directional axis (Y-axis) of the connecting plate 2 as the axis of rotation can be generated, as shown by a sectional view along a line B—B in the X-axis shown in FIG. 17C.

Figure 18:
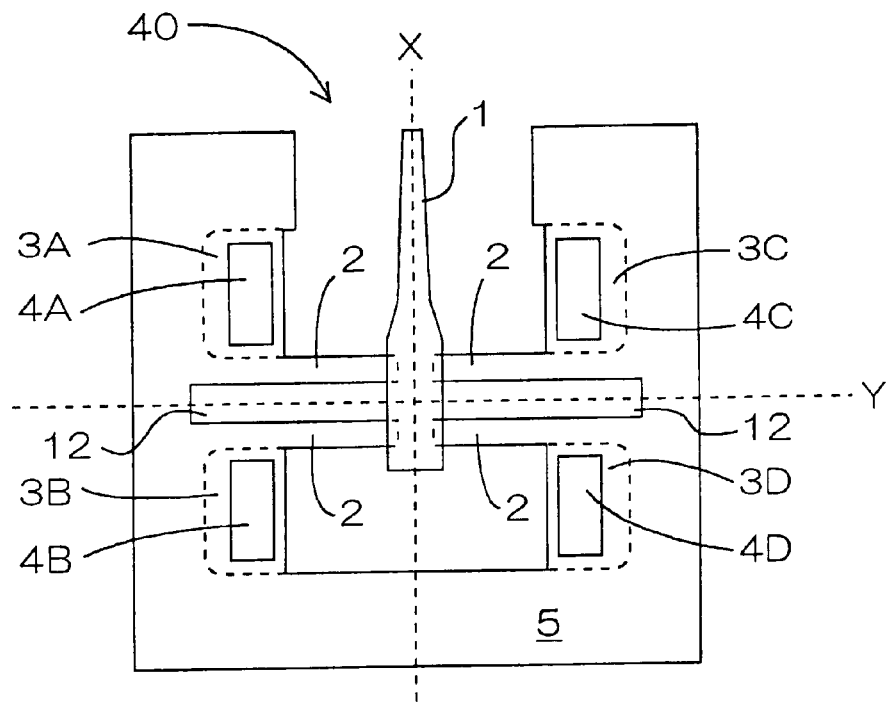
FIG. 18 shows a plan view of still another embodiment of a piezoelectric/electrostrictive device of the present invention.

Now, a device 40 shown in FIG. 18 has a shape that a connecting plate 2 is halved in the longitudinal direction (X-axis direction) of the fixing plate 1, and the halved connecting plates 2 are further halved respectively in the straddling direction (Y-axis direction) of the connecting plate 2. Accordingly, the fixing plate 1 is joined with surfaces of each one side of the connecting plates 2, as if to overlay resultantly on four connecting plates 2. Here, it goes without saying that the connecting plate 2 and the fixing plate 1 are integrally formed, and the connecting plate 2 may be split into three or more. Such splitting of a connecting plate in the longitudinal direction (X-axis direction) of a fixing plate implies not only a case where the width in the X-axis direction of a connecting plate newly formed becomes smaller as a result of a gap formed by splitting the connecting plate, but also a case where a plurality of connecting plates are arranged in parallel via gaps therebetween without changing the width of the connecting plate in the X-axis direction.

In the device 40, as the piezoelectric elements 4A to 4D are structured to respectively drive the separate connecting plates 2 via corresponding diaphragms 3A–3D, a plurality of points (joints) for exerting distortion of the piezoelectric elements 4A to 4D on the fixing plate 1 can be taken, for example, the fixing plate 1 can be efficiently driven in the in-plane rotational displacement mode, by driving the piezoelectric elements 4A and 4D in the same phase, and the piezoelectric elements 4B and 4C in a phase opposite to the piezoelectric elements 4A and 4D.

Further, the fixing plate 1 can be driven in the uniaxial directional displacement mode, by driving the piezoelectric elements 4A and 4C in the same phase and the piezoelectric elements 4B and 4D in the opposite phase to the piezoelectric elements 4A and 4C, however, as a gap 12 is formed at this time between the connecting plates 2 in the X-axis direction, it becomes possible to obtain a displacement more genuine than the one obtained by the device 37 or the like described previously.

At the gap 12, a plate-shaped member thinner than the connecting plate 2 may be straddled between the connecting plates 2 in the X-axis direction. In this case, if compared with a case where the plate-shaped member is unstraddled, the rigidity is raised, and the fixing plate 1 is enabled to operate at a faster speed of response, although the relative displacement quantity of the fixing plate 1 is lowered. Further, the gap 12 is unrequired to be formed for the entire length (length in the Y-axis direction) of the connecting plate 2, and the effect thereof is obtainable even if the formation is for a partial range.

Figure 19:
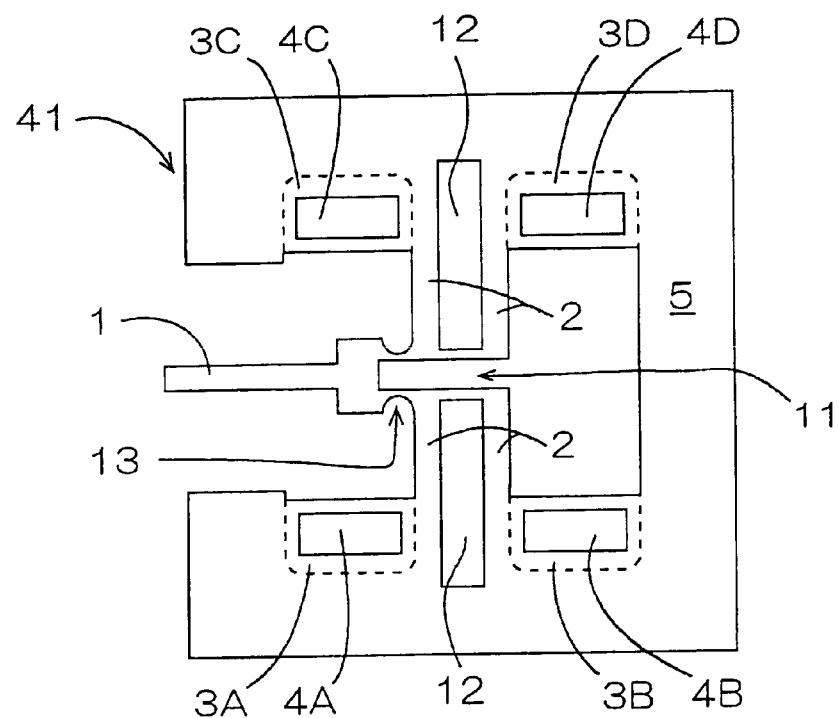
FIG. 19 shows a plan view of still another embodiment of a piezoelectric/electrostrictive device of the present invention.

FIG. 19 shows a plan view of a device 41 which is structured such that a fixing plate 1 is integrally joined with two connecting plates 2 formed by halving a connecting plate in the longitudinal direction of a fixing plate 1, a hinge 13 is provided on the fixing plate 1 from the joint of the fixing plate 1 with the connecting plate 2 toward the longitudinal direction of the fixing plate 1, and a notch 11 is further formed on the joint of the fixing plate 1 with the connecting plate 2. As the hinge 13 supports the fixing plate 1 for driving in the in-plate rotational displacement mode, by being simultaneously formed with the notch 11, large displacement quantity is made effectively obtainable. Without saying, such hinge 13 can also be formed on the devices 37 to 40 described previously.

Now, FIGS. 20A to 20D show still another embodiment of a device of the present invention. A device 42 is, for example, as shown in FIG. 20A, when two diaphragms 3A and 3B are used, equivalent to the above-described device 35 wherein a substrate 5 is integrated and a fixing plate 1 is extruded to only one side, and the diaphragms 3A and 3C are removed.

In other words, the device 42 has a structure where a connecting plate 2 is straddled between sides of recess portions 10 formed on a substrate 5, two diaphragms 3A and 3B having piezoelectric elements 4A and 4B arranged thereon are straddled between the connecting plate 2 and the bottom surfaces of recess portions 10 of the substrate 5, the fixing plate 1 is joined with the connecting plate 2 so as to have the longitudinal direction of the fixing plate 1 made to be parallel with the straddling direction (X-axis direction) of the diaphragms 3A and 3B. Further, the diaphragms 3A and 3B are arranged in a position symmetrical to the longitudinal directional axis (X-axis) of the fixing plate 1. Further, two or more diaphragms may be straddled between the connecting plate 2 and the bottom surfaces of the recess portions 10, Relation of joining positions of the connecting plate 2, the diaphragms 3A and 3B, and the substrate 5 in the device 42 may also be expressed that the connecting plate 2 is straddled between bottom surfaces of opposite recess portions formed on the substrate 5, and in the respective opposite two recess portions, one diaphragm 3A and the diaphragm 3B are straddled between the connecting plate 2 and the sides of the recess portions.

In other words, a recess portion in a device of the present invention may be expressed in different ways depending on ways of observation. In the device 42, two sides of the recess portions 10 shown previously are considered to be respective bottom surfaces of the opposite two recess portions, and the bottom surfaces of the recess portions 10 can be regarded as a site where each of one side of the opposite two recess portions are shared. As such, in a device of the present invention, even if the shape thereof is the same, there may be occasion when expression methods can be reworded in different ways.

FIGS. 20B to 20D show sectional views along a line A—A in the X1-axis of a structure of the diaphragm 3B preferably employed in the device 42. The structure of the diaphragm 3B can naturally be applicable to the diaphragm 3A. FIG. 20B shows a structure where the diaphragm 3B is straddled in the vicinity of respective surfaces of the connecting plate 2 and the substrate 5.

FIG. 20C show a structure where a set of two diaphragms 3B and 3C composed to have respective one surface to opposite each other are straddled between the connecting plate 2 and the substrate 5. In this case, the diaphragm 3A is also separately provided with one diaphragm 3D to be a set of two, and the fixing plate 1 is driven by four, in total, diaphragms 3A to 3D.

In such a structure, by driving the piezoelectric elements 4B and 4C in the same phase, and the piezoelectric elements 4A and 4D (a piezoelectric element arranged on a diaphragm 3D not shown) in the opposite phase to the piezoelectric elements 4B and 4C, an in-plane rotational displacement can be dominantly generated to the fixing plate 1, and by driving all piezoelectric elements 4A to 4D in the same phase, a uniaxial directional displacement can be dominantly generated.

In this manner, in comparison with a case where two diaphragms/piezoelectric elements are used, there is an advantage that not only the suppression of a displacement of the fixing plate 1 in the Z-axis direction can be made possible, but also the displacement quantity and the driving force of the fixing plate 1 can be made larger, which is preferable. Further, as described previously, in correspondence with a case where the number of the diaphragm to be straddled between a connecting plate 2 and a bottom surface of a recess portion 10 can be two or more, a set of two diaphragms composed one surface so as to opposite each other can be arranged in two sets or more.

FIG. 20D shows a structure where the diaphragm 3B is arranged at the center in the thickness direction (Z-axis direction) of the connecting plate 2. In this case, the point of application of the piezoelectric element 4B (diaphragm 3B) relative to the connecting plate 2 can be made as the position of the center of gravity, thus the displacement of the fixing plate 1 in the Z-axis direction can be reduced, which is preferable.

Further, structures of the diaphragm shown in these FIGS. 20C and 20D can be applicable also to other embodiment having a structure for interposing a connecting plate. Namely, when the structure shown in FIG. 20C is applied, a connecting plate is interposed by two sets of diaphragms, each set comprising two diaphragms, and when the structure shown in FIG. 20D is applied, a connecting plate is interposed by two diaphragms at the center of the thickness direction of the connecting plate.

Figure 21:
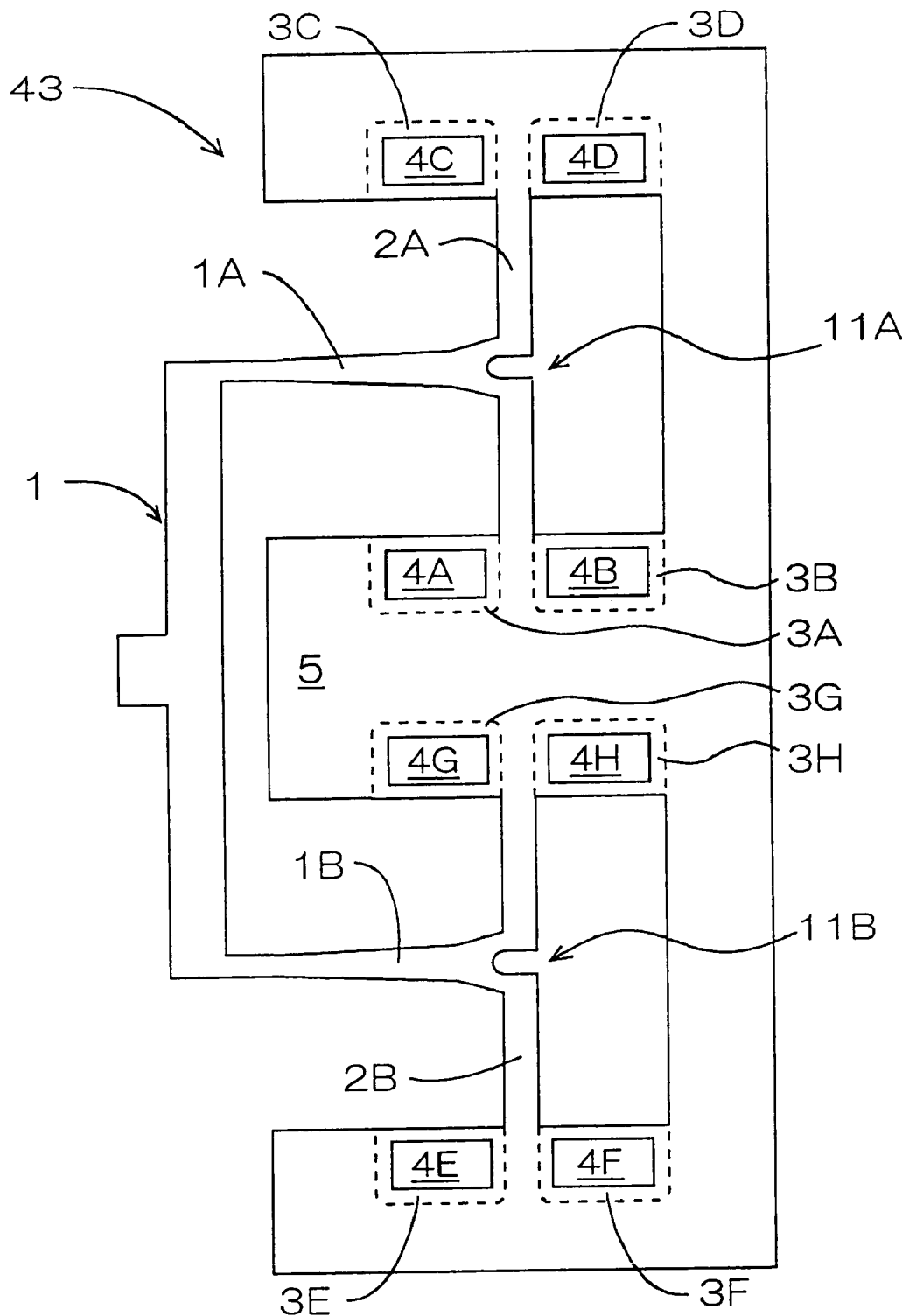
FIG. 21 shows a plan view of still another embodiment of a piezoelectric/electrostrictive device of the present invention.

Now, FIG. 21 shows a plan view of a device 43 with two devices 38 previously described in FIG. 16 joined therewith. In the device 43, a connecting plate 1A driven by piezoelectric elements 4A to 4D is joined with a fixing plate 1B driven by piezoelectric elements 4E to 4H, and an integrated fixing plate 1 is formed. By making such structure, such effects are generated that a largely generated displacement can be maintained, and the driving force of a device can be increased. By this manner, for example, when other elements such as a variety of sensors, magnetic heads, or the like are fixed to a fixing plate 1, suitable selection can be facilitated, depending on the size and the mass of the device, which structure is to be employed, a structure of the device 38, or a structure of the joined device 43.

The device 43 is characterized in that from the viewpoints of displacement control and vibration control, by driving one of the connecting devices (for example, one on the fixing plate 1B) for braking at a predetermined timing, unnecessary residual vibration of the fixing plate 1 generated in operation at a high speed can be reduced, and positioning can be performed at a high speed. Such connecting of devices is not limited to the case when the device 38 is used, and is applicable to all devices 37 to 42 shown in drawings from FIG. 15 to FIG. 20.

Figure 22:
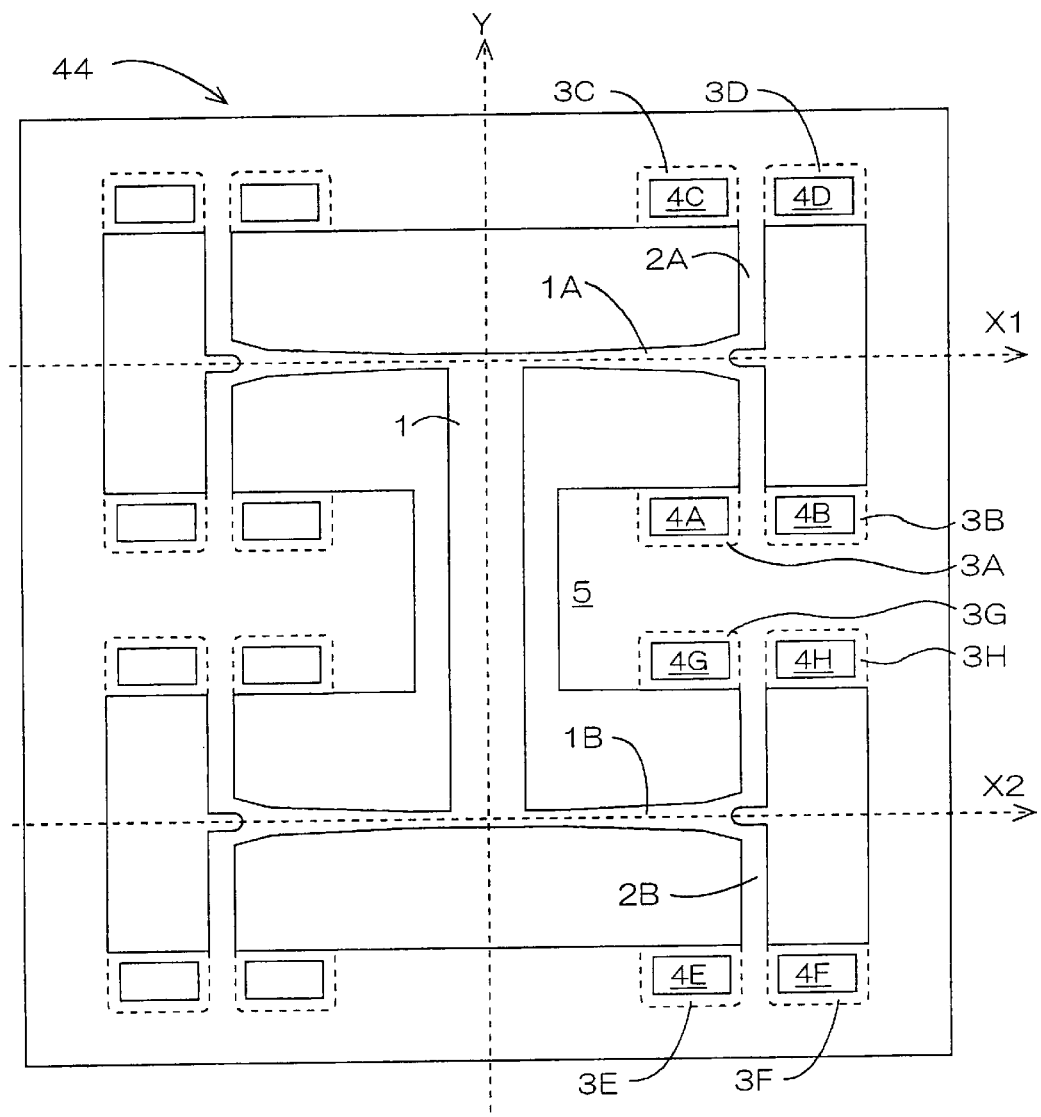
FIG. 22 shows a plan view of still another embodiment of a piezoelectric/electrostrictive device of the present invention.

Connecting of devices of the present invention described previously, is not limited to connecting of two devices, and it is possible to connect two or more devices considering contents of the embodiments. As an example, FIG. 22 shows a plan view of a device 44 which is formed by connecting four of the devices 38 shown in FIG. 16. The device 44 is, in other words, structured by connecting two of the devices 43 shown in FIG. 21 so as to be symmetrical to the Y-axis, and by having such structure, a more genuine displacement in the Y-axis direction or in the X-axis direction (X1-axis direction, X2-axis direction) is made possible to be generated with stronger force.

Heretofore, although the structure of the third device of the present invention is described, the displacement modes of the fixing plate, namely a variety of displacement modes such as the in-plane rotational displacement, the uniaxial directional displacement, and the rotational displacement are, in the same manner as the displacement modes of the first and the second devices, mean that the displacement direction of a fixing plate is dominant in the direction respectively described, and other directional components than those described are not totally excluded. It should be noted that, when application is considered to a magnetic head, of all devices of the present invention, it is preferable to use a variety of displacement modes which do not three-dimensionally displace in order that a gap between the head and the record medium can be kept constant.

By the way, although a variety of devices described above are structured in unimorph structure, of course there is no problem with bimorph structure, and further, without saying, the numbers of diaphragms and piezoelectric elements to be arranged can be optionally selected within a range not deviating from the designing idea of the above-described devices. The application of the devices of the present invention are, as described previously, not limited to active elements such as displacement elements or oscillators which are driven by piezoelectric elements, but apply to a variety of sensors, being passive elements, such as acceleration sensors, impact sensors, and the like. Specifically, in detecting acceleration, the detectivity can be easily improved by making the tip of a fixing plate heavier by arranging the inertial mass such as a weight at the tip.

Figure 23A:
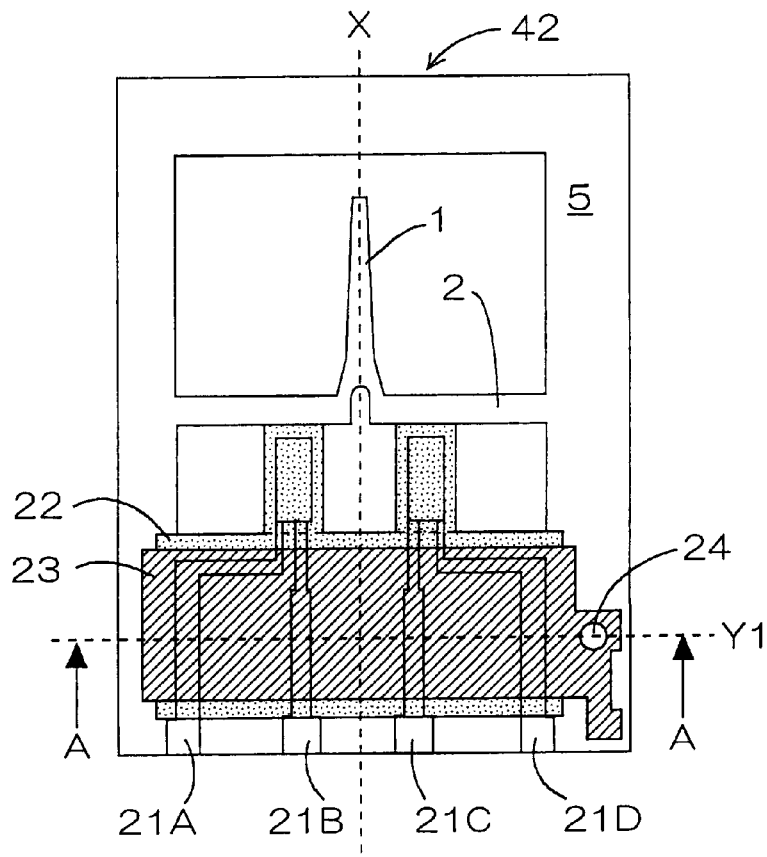
FIG. 23A is a plan view.

Now, taking previously described device 42 as an example, a shape of forming an electrode lead from a piezoelectric element is described. FIG. 23A shows a plan view of an embodiment wherein electrode leads 21A to 21D are arranged on piezoelectric elements 4A and 4B arranged on the device 42, an insulating layer 22 is further arranged on the piezoelectric elements 4A and 4B and the electrode leads 21A to 21D, and a shielding layer 23 is further formed so as to coat the insulating layer 22, and FIGS. 23B to 23D respectively show sectional views along a line A—A in the Y1-axis in FIG. 23A and illustrate different embodiments.

The insulating layer 22 has a function to effectively prevent short circuits of the piezoelectric elements 4A and 4B or the electrode leads 21A to 21D when a fixing plate 1 or piezoelectric elements 4A and 4B are used in a liquid atmosphere, in a moistening atmosphere, or the like. The shielding layer 23 has functions to shield electromagnetic waves from the outside and to favorably secure the displacement precision, and further to prevent inclusion of erroneous operation or a noise when the device is driven high frequency, or detected at vibration of high frequency, or the like.

Figure 23B:
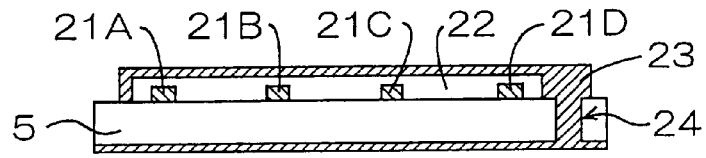
FIGS. 23B, 23C, and 23D show sectional views of protective form of the electrode and the like of a piezoelectric/electrostrictive device of the present invention, and thereof.
Figure 23C:
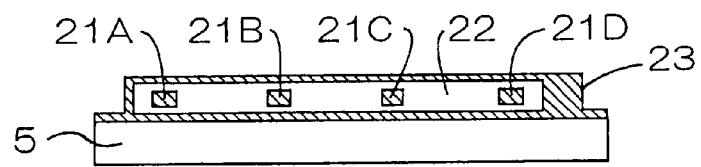
Figure 23D:
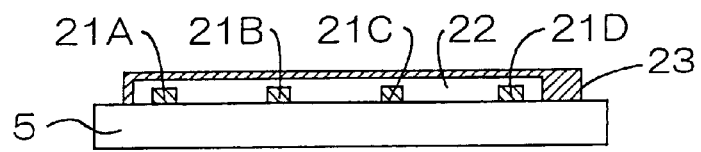

With regard to structures for the arrangement of the shielding layer 23, in addition to a structure to be formed as if to have a substrate 5 interposed therein as shown in FIG. 23B, there are a structure to surround only the wiring portion of the substrate 5 as shown in FIG. 23C, and a structure to shield the wiring portion only by upper one side thereof as shown in FIG. 23D. Among these, preferable is structure where the wiring portion is wholly shielded as shown in FIG. 23B or FIG. 23C. Further, in FIG. 23A, continuity of the shielding layers 23 formed on respective surfaces on the surface 5 is secured by use of a through-hole 24 arranged on the substrate 5, the continuity may be arranged by use of the side of the substrate 5. A material to be preferably used in forming the insulating layer 22 and the shielding layer 23 is to be described later in details together with a material for composing a device.

Now, a material to be used for a device of the present invention is described. Any insulator or dielectric material can be used as long as a substrate, a fixing plate, a connecting plate, and a diaphragm can be integrally formed with a piezoelectric element thereby without use of an adhesives, and ceramics are preferably used. For example, as an oxide, fully-stabilized zirconia, partially-stabilized zirconia, alumina, magnesium, or the like, and as a non-oxide, silicon nitride, or the like, may be listed. Of these, fully-stabilized zirconia or partially-stabilized zirconia is most preferably employed, so as to have large mechanical strength, high toughness when it is formed to be thin plate, and low reactivity with a piezoelectric film and an electrode material. Further, when fully-stabilized zirconia or partially-stabilized zirconia is used as a material for the substrate or the like, it is preferable that at least a diaphragm is composed of a material containing alumina, titania, or the like as an additive.

Further, ceramics can be preferably used from standpoint of securing reliability of joints of respective members, simplification of fabricating process, and the like, as a device can be integrally formed by use of the green sheet laminating method to be described hereinafter.

As described previously, there is no limitation whatsoever about the thickness or the shape of a fixing plate in a device of the present invention, and it can be suitably designed depending on an application use, the thickness of a substrate can be suitably determined considering operability, and is unnecessary to be plate-shaped. Contrarily, the thickness of a diaphragm is preferably to be around 3 to 20 $\mu$m, and combined thickness of the diaphragm and a piezoelectric element is preferably 15 to 60 $\mu$m. Further, the thickness of a connecting plate is preferably 20 to 600 $\mu$m, and the width thereof is preferably 30 to 500 $\mu$m. The aspect ratio (width (length in the X-axis direction)/length in the thickness direction (Z-axis direction)) of the connecting plate is preferable to be within a range of 0.1 and 15, and more preferably to be within a range of 0.1 and 7, specifically in order to make a displacement in the X-Y plane to be dominant.

As a piezoelectric film in a piezoelectric element, piezoelectric ceramics formed to be a film is preferably used, and electrostrictive ceramics, ferroelectric ceramics, or antiferroelectric ceramics can also be used. The material can be either one requiring or not requiring polarization treatment. However, when the material is used for a magnetic head or the like, a material having small hysteresis of strain may be preferably used, as the lineality of the displacement quantity of a fixing plate with the driving voltage or the output voltage is considered to be important, and therefore, it is preferable to use a material of 10 kV/mm or less as a coercive electric field.

As a concrete piezoelectric ceramics, there are ceramics such as lead zirconate, lead titanate, lead magnesium niobate, lead nickel niobate, lead zinc niobate, lead manganese niobate, lead antimony stannate, lead manganese tungstate, lead cobalt niobate, lead magnesium tantalate, barium titanate, or the like, and ceramics containing a component of any of these combined. Out of these, a material containing a component composed of lead zirconate, lead titanate, and lead magnesium niobate as the major component is preferably used in this invention, and the reasons are that such material has the high electromechanical coupling factor and piezoelectric constant, is usable in forming a piezoelectric film of predetermined composition in stabilized way, as having small reactivity with a substrate (ceramic substrate) when the piezoelectric film is sintered.

Further, to the aforementioned piezoelectric ceramics, may be added are ceramics of any one of oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, or the like, or ceramics of combination of any ones of these oxides, or ceramics suitably added with other compounds of above-mentioned oxides. For example, it is also preferable to use lead zirconate, lead titanate, and lead magnesium niobate as the major components, lanthanum or strontium is contained therein, and the coercive electric field or piezoelectric property thereof is adjusted for use.

On the other hand, an electrode of a piezoelectric element is preferably composed of a metal which is solid at room temperature and superior in conductivity, and such metal, for example, as aluminum, titanium, chromium, iron, cobalt, nickel, copper, zinc, niobium, molybdenum, ruthenium, palladium, rhodium, silver, tin, tantalum, tungsten, iridium, platinum, gold, lead, or the like may be used, singularly or as an alloy made by combining any of the metals, and further, a cermet material produced by dispersing the same material with the piezoelectric film or the diaphragm may also be used.

Selection of the material for the electrode in a piezoelectric element is determined depending on the method of forming a piezoelectric film. For example, when a piezoelectric film is formed on a first electrode by sintering after the first electrode is formed on a diaphragm, it is necessary to use for the first electrode a metal having a high melting point such as platinum or the like which is not changed by the sintering temperature of the piezoelectric film, however, a second electrode, to be formed on the piezoelectric film after the piezoelectric film is formed, can be formed at a low temperature, and therefore a metal having a low melting point such as aluminum or the like can be used.

Moreover, whereas a piezoelectric element can also be formed by being integrally sintered, in this case, both a first electrode and a second electrode are to be made by a metal having a high melting point which can withstand the sintering temperature for a piezoelectric film. On the other hand, as shown in FIG. 6, when a first electrode 91 and a second electrode 92 are formed on a piezoelectric film 90, both electrodes can be formed by use of a metal having a low melting point. In this manner, the first electrode and the second electrode may be suitably selected depending on the forming temperature of the piezoelectric film represented by the sintering temperature of a piezoelectric film, and the structure of a piezoelectric element. Further, an electrode lead can be simultaneously formed with an electrode in a piezoelectric element, or the electrode lead on a diaphragm is first formed simultaneously with a piezoelectric element, and the electrode lead on a substrate may be formed afterward by a variety of methods such as the sputtering method, the screen printing method, or the like.

As a material of an insulating layer to be formed on a piezoelectric element and an electrode lead, although glass or a resin where having insulating property is used, the resin can be more preferably used than glass in view of improving the performance of a device without obstructing a displacement, and fluororesin superior in chemical stability can be preferably used as the fluororesin. For example, polytetrafluoroethylene based Teflon (Teflon PTFE made by Du Pont K.K.), polytetrafluoroethylene-hexafluoropropylene copolymer based Teflon (Teflon FEP), polytetrafluoroethylene-perfluoroalkylvinylether copolymer ethylene-tetrafluororide-based Teflon (Teflon PFA), PTEF/PFA composite Teflon, or the like may be preferably used.

Moreover, though inferior to the above-described fluororesin in corrosion resistance, weather resistance, or the like, silicone resin (particularly, thermosetting silicone resin) is also preferably used. Furthermore, it is also possible to use epoxy resin, acrylic resin, or the like, corresponding to the purpose. Further, it is also preferable to form an insulating layer on a piezoelectric element and vicinity therearound, and on an electrode lead and vicinity therearound, by use of a material different from each other. Furthermore, it is preferable to add an inorganic or organic filler to an insulating resin and to adjust the rigidity of a diaphragm or the like.

As a material for a shielding layer to be formed on an insulating layer, when the insulating layer is already formed, a variety of metal, such as gold, silver, copper, nickel, aluminum, or the like is preferably used, and in addition thereto, any metallic material which is used in an electrode or the like in the above-described piezoelectric element can be used. Further, conductive paste composed by mixing metallic powder with a resin can also be used.

Now, a method of fabricating a device of the present invention is described referring to the above-described device 38 as an example. The device of the present invention, as composed of a plurality of members such as a connecting plate, a fixing plate, and the like, can be fabricated of the members, composed of a variety of material, prepared as separate bodies, by having them respectively joined. However, in this case, productivity being not high, and a damage or the like being likely to occur at a joint, there is a problem of reliability. In the situation, in the present invention, the green sheet laminating method using ceramic powder as a material is preferably employed.

Figure 24:
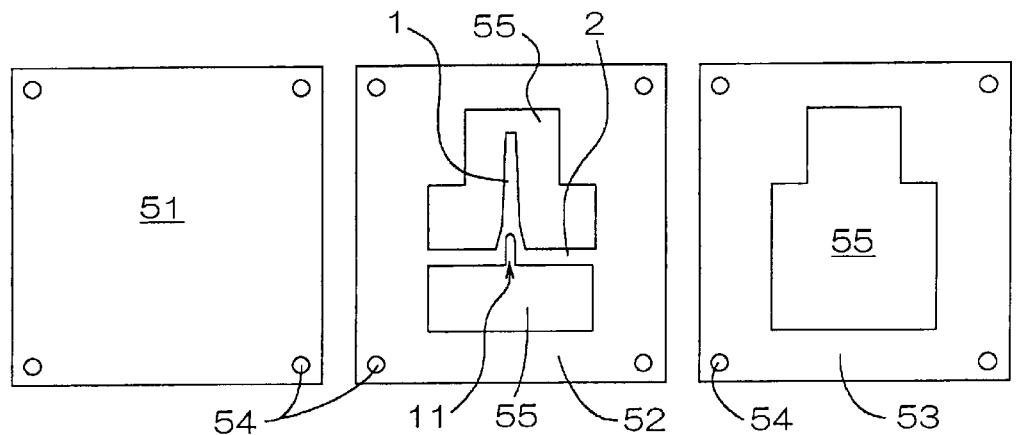
FIG. 24 shows a plan view of a form example of a sheet member to be used in fabricating a piezoelectric/electrostrictive device of the present invention.

In the green sheet laminating method, firstly, slurry is prepared by adding and mixing a binder, a solvent, a dispersant, and the like to ceramic powder such as zirconia, or the like, which is a material, then the slurry is treated for degassing, and then from the slurry, a green sheet or a green tape having predetermined thickness is fabricated by the reverse roll coater method, the doctor blade method, or the like. The green sheet is then subjected to machining by die-cutting (punching) by use of a die or the like to fabricate a variety of green sheet member (hereinafter referred to as "sheet member") as shown in FIG. 24.

A sheet member 51 is a member to be a substrate 5, a connecting plate 2, fixing plate 1, and diaphragms 3A to 3D after being sintered, and at this moment, the sheet member 51 is still a single plate with unclear shapes thereof. This is because, as described previously, as the diaphragms 3A to 3D are preferably to be thinly formed with the thickness of 3 to 20 $\mu$m, it is more preferable to cut off an unnecessary portion by laser machining or the like after being sintered than to form a shape of respective members from the green sheet, as the shape precision can be more finely maintained.

A sheet member 52 is a member for not only forming a substrate 5, but also forming a fixing plate 1 and a connecting plate 2 with a thickness thicker than diaphragm 3A to 3D, and a reference hole 54 and a window 55, a fixing plate 1, and connecting plate 2 are formed thereon. At a joint between the fixing plate 1 and the connecting plate 2, a notch 11 may have been formed. Further, the notch 11 can be machined and formed by the laser machining or the like after the sintering. The sheet member 52 is laminated in predetermined number more than one, and a fixing plate 1 and a connecting plate 2 in predetermined thickness are obtained. When a fixing plate 1 is formed to be thinner than a connecting plate, a sheet member is prepared from the sheet member 52 by removing a portion to be the fixing plate 1, and the sheet member is laminated. A sheet member 53 with a reference hole 54 and a window 55 formed thereon is a member to be a substrate 5. By laminating in predetermined number more than one, desired thickness can be obtained.

These sheet members 51 to 53 are laminated in this sequence while positioning by use of the reference hole 54, then integrated by such method as the thermo-compression method or the like, and a laminated body is fabricated. Then the laminated body is sintered at a temperature of 1200 to 1600° C., and piezoelectric elements 4A to 4D, formed in a sheet member 51 in advance at positions where diaphragms 3A to 3D are formed, are also preferably sintered integrally with the laminated body.

As a method for arranging piezoelectric elements 4A to 4D by having a laminated body and the piezoelectric elements simultaneously sintered in such manner, a method is that a piezoelectric film is molded by the press molding method by use of a die or the tape molding method by use of a slurry material, and the piezoelectric film prior to sintering is laminated on a sheet member 51 by the thermo-compression method, which is then simultaneously sintered to simultaneously produce a substrate and a piezoelectric film. However, in this case, it is necessary to form an electrode in advance on the substrate or the piezoelectric film by use of the film forming method to be described later.

Temperature for sintering a piezoelectric film is suitably determined depending on a material composing the piezoelectric film, and it is generally set at 800 to 1400° C., and preferably at 1000 to 1400° C. In this case, in order to control the composition of the piezoelectric film, it is preferable to sinter with atmosphere adjustment under the existence of evaporation source of the material of the piezoelectric film. It is preferable that the above-mentioned atmosphere adjustment for mitigating sintering stress and for drawing out a higher material property of the piezoelectric film, specifically when a sintered substrate to be described later is used, is controlled by observing the sintered piezoelectric film by an electron microscope to monitor distribution of the components.

For example, when a material containing lead zirconate is used, such as a material having a component as the major component, comprising lead zirconate, lead titanate, and lead magnesium niobate, which being piezoelectric ceramics preferably employed in the present invention, it is preferable to sinter by adjusting an atmosphere so that a zirconium component is segregated on the sintered piezoelectric film. It is more preferable to make the atmosphere such that whereas segregation of zirconium component is noticed on the surface of a piezoelectric film, the segregation is scarcely noticed inside the piezoelectric film. A piezoelectric film having such component distribution is, in comparison with a piezoelectric film without the segregation, superior in the vibration property, namely having a large vibrational amplitude, and has a feature that the material property intrinsic to the piezoelectric powder is maintained without being largely deteriorated, as the sintering stress is mitigated by the segregation of zirconium component.

Accordingly, in a device of the present invention, it is most preferable to form a piezoelectric element to have such piezoelectric film. Moreover, when composing a piezoelectric film composition as previously described, and when using a piezoelectric material, containing specifically titanium oxide described above as a component, for respective members of a device, for example a connecting plate, a spring plate, a substrate, and the like, after the piezoelectric film is sintered, it is also preferable that the respective members of the device are sintered under an atmosphere containing titanium oxide. When a piezoelectric film and a substrate are simultaneously sintered, the sintering conditions of the both are necessary to be matched.

Further, at a position in a laminated body where a diaphragm is formed after sintering, a piezoelectric element is possible to be arranged by the thick film forming method, such as the screen printing method, the dipping method, the coating method, the electrophoresis, or the like, and a variety of the thin film forming method, such as the ion-beam method, the sputtering method, the vacuum deposition method, the ion-plating method, the chemical vapor deposition method (CVD), plating, or the like. Out of these methods, the present invention preferably employs, in order to form a piezoelectric film, the thick film forming method by the screen printing method, the dipping method, the coating method, the electrophoresis, or the like. This is because these methods enables to have a piezoelectric film formed by use of paste, slurry, suspension, emulsion, sol, or the like, containing particles of piezoelectric ceramics of the average particle size of 0.01 to 5 $\mu$m, preferably 0.05 to 3 $\mu$m, as the major component, and to obtain a preferable piezoelectric operating characteristic. Moreover, particularly, the electrophoresis makes it possible to form a film at a high density and a high shape precision, and has features as described in a technical paper ""DENKI KAGAKU" Vol. 53, No. 1 (1985), pp. 63–68, written by Kazuo Anzai". Therefore, it is preferable to suitably select a method considering a required precision, reliability, and the like.

For example, after the fabricated laminated body is sintered at a predetermined condition, a first electrode is printed at a predetermined position on the surface of a sintered sheet member 51, and then sintered, then a piezoelectric film is printed and sintered, and a second electrode is printed and sintered to have a piezoelectric element arranged, and an electrode lead for connecting an electrode in the formed piezoelectric element to a measuring apparatus is printed and sintered. Here, for example, if platinum (Pt) is used for the first electrode, lead zirconate titanate (PZT) for the piezoelectric film, gold (Au) for the second electrode, and silver (Ag) for the electrode lead, the sintering temperature in the sintering process can be set to be gradually lower, any materials sintered in an earlier stage are, at any sintering stage, never subjected to re-sintering, enabling to avoid occurrence of troubles such as exfoliation or aggregation of the electrode material or the like.

Moreover, by selecting a suitable material, it is possible to sequentially print respective members and electrode leads of a piezoelectric element, for integrally sintering at one time. On the other hand respective electrodes and the like can be provided at a lower temperature after the piezoelectric film is formed. Respective members and electrode leads of a piezoelectric element may be formed by the thin film forming method such as the sputtering method, the vapor deposition method, or the like, and in this case, heat treatment is not necessarily required.

By forming a piezoelectric element by the film forming method in this manner, a piezoelectric element and a diaphragm can be integrally joined and arranged without using an adhesive, thus reliability and reproducibility are secured and integration can be facilitated. Here, a piezoelectric film may further be formed in a suitable pattern, and as a method of forming thereof, a mechanical machining method such as, for example, the screen printing method, the photolithography method, the laser machining method, slicing, ultrasonic machining, or the like can be used.

By the way, in fabricating a device of the present invention, a portion to be a piezoelectric operating portion is made to have a predetermined curvature in the state after being sintered. For this purpose, it is necessary that the material properties, the thermal shrinkage behavior, the design measurement, the shape, and the like of a diaphragm and a piezoelectric element are suitably set at preferable conditions to be combined for actual use.

For forming a diaphragm in a curvature, a method is to control the behavior of respective sheet members 51 to 53 at the time of sintering by respectively making a sheet member 51 forming a diaphragm, a sheet member 52 to be a major portion of a fixing plate and a connecting plate, and a sheet member 53 mainly to be a substrate, to have differences in the sintering shrinkage ratio and the sintering speed thereof in a direction parallel to the surface of the sheet.

Another method is that, in a laminated body made by having sheet members 51 to 53 subjected to the thermocompression joining, the sheet member 51 is deformed in the green sheet state, by providing a pressure difference between the side of a window 55 of the sheet members 52 and 53 interposing the sheet member 51, and the opposite side thereof. At this time, in order to make the side of the window 55 to be concave, the side of the window 55 is made to be a positive pressure, and the opposite side is made to be a negative pressure, and when the side of the window 55 is made to be convex, the pressure state is reversed.

Furthermore, for forming the curvature in a stabilized way, there is also a method to form a curvature portion having a predetermined radius of curvature and a curvature height in the convex direction, by abutting a flattening jigs or a recess portion forming jigs at the curved ridge and in the vicinity thereof, at the time or after the time of formation of the curvature on the diaphragm.

On the other hand, for forming a piezoelectric element in a curvature, a method is that a piezoelectric element is formed on a concave surface and/or a convex surface of a diaphragm shaped in advance into a curvature by the method described previously. There is also another method where a piezoelectric element is formed on one surface of a planarly formed diaphragm and then sintered, and the diaphragm is curved by sintering shrinkage of the piezoelectric element. It is important to set a degree of the curvature of the diaphragm, foreseeing the curvature of the diaphragm caused by the sintering shrinkage of the piezoelectric element, irrespective of the surface of the diaphragm where the piezoelectric element is formed being concave or convex.

Further, when setting a curvature of a piezoelectric operating portion, the coefficient of thermal expansion of a material to be a diaphragm or a substrate is also an important setting factor. In order to facilitate control of a curvature of a piezoelectric operating portion, to have the sintering stress for a piezoelectric element (piezoelectric film) suppressed to a lower level, and to facilitate to obtain a predetermined shape and piezoelectric properties, in a process of integration by heat treatment of a laminated body and the piezoelectric element, it is preferable to use a material for a substrate having the coefficient of thermal expansion at $60 \times 10^{-7}/°$ C. to $120 \times 10^{-7}/°$ C., more preferably at $80 \times 10^{-7}/°$ C. to $110 \times 10^{-7}/°$ C.

In this manner, a diaphragm, a fixing plate, a connecting plate, and a notch as required are formed at predetermined positions of a sintered laminated body having a piezoelectric element and an electrode lead formed thereon. Here, it is preferable to remove an unnecessary portion of a sintered sheet member 51 by cutting-off machining by way of machining using the fourth harmonics of the YAG laser. In this manner, a device 38 having diaphragms 3A to 3D, a fixing plate 1, and a connecting plate 2 in shapes shown in FIG. 16 is obtained. Further, a portion which corresponds to a substrate 5, but is unrequired may be removed by the laser machining or dicing as described previously.

It is also preferable to reduce a variation of the shape of a piezoelectric driving portion as well as to adjust displacement quantity and displacement characteristics by adjusting, at the timing of such machining, a shape of a fixing plate 1 or a connecting plate 2 formed mainly by a sheet member 52, and a shape of diaphragms 3A to 3D and the like formed by a sheet member 51.

Figure 25:
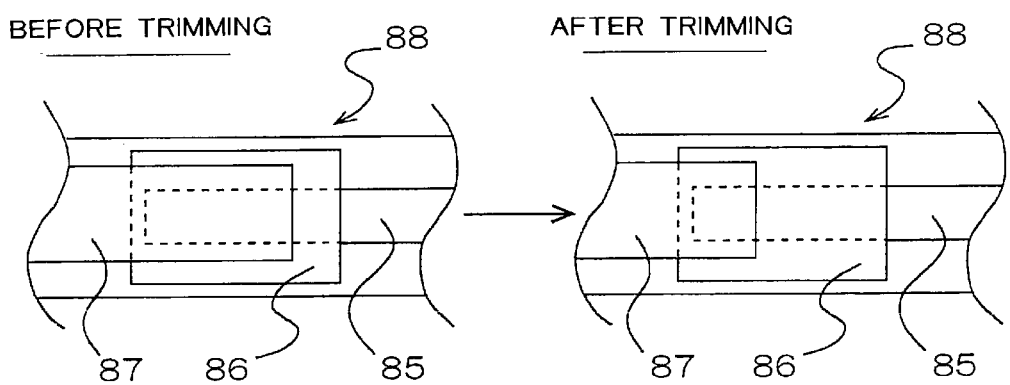
FIG. 25 shows an explanatory view of an example of a method of fabricating a piezoelectric/electrostrictive device of the present invention.
Figure 26:
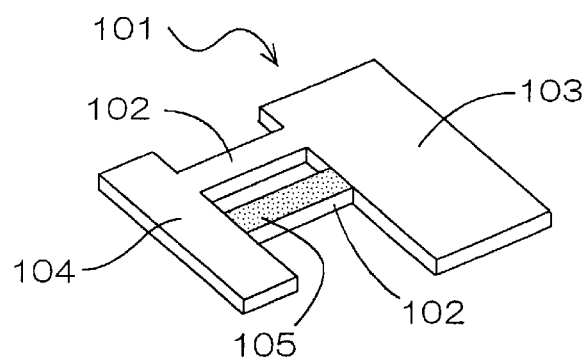
FIG. 26 shows a squint view of an example of a structure of a conventional piezoelectric/electrostrictive device (piezoelectric actuator)

Further, it is also preferable to obtain a predetermined displacement characteristics by having the piezoelectric element 88 shown in FIG. 5 arranged with the second electrode 87 as an upper electrode, the first electrode 85 as a lower electrode, and the piezoelectric film 86 formed between the upper and lower electrodes as shown in FIG. 25, and thereafter, the upper electrode is trimmed by the fourth harmonics of a YAG laser, mechanical machining, or the like to adjust the available electrode area of the piezoelectric element, and to adjust the electric characteristics such as impedance or the like. When the piezoelectric element 88 has the comb-shaped structure shown in FIG. 6 or FIG. 7, a part of one or both electrodes may be trimmed.

In such machining, in addition to the machining using the above described fourth harmonics of a YAG laser, a variety of machining methods suited for the size and the shape of a device, such as the laser machining by the YAG laser and the second and the third harmonics of a YAG laser, the excimer laser, the $CO_2$ laser, or the like, the electron-beam machining, dicing (mechanical machining), or the like, can be applied.

Moreover, a device of the present invention can be fabricated by use of the pressure molding method or the cast molding method using a forming die, the injection molding, or the like, in addition to the above-described methods of fabricating using a green sheet. In these cases, the device is subjected to machining by cutting or grinding machining, laser machining, die-cutting using a punch, or mechanical machining such as ultra-sonic machining or the like, to prior and after sintering, and it is formed into a predetermined shape.

An insulating layer formed on piezoelectric elements 4A to 4D and electrode leads in the device 38 thus fabricated can be formed by the screen printing method, the coating method, the spraying method, or the like, by use of glass or a resin. When glass is used here as a material, the device per se is to be heated to a temperature around the softening temperature of the glass, and a displacement or vibrations may be inhibited because of the high degree of hardness of the glass, while the resin is soft and requires treatment only such as drying, and thus the resin can be preferably used for the insulating layer.

It is already described that that fluororesin or silicone resin can be preferably used as a resin for an insulating layer. However, when using either of these resins, it is preferable to form a primer layer in correspondence with the type of the resin and the ceramics to be used, and to form the insulating layer thereon, in order that the adhesive properties with the underlying ceramics can be improved.

When a shielding layer is formed on an insulating layer, if the insulating layer is composed of a resin, it is difficult to have a sintering process. When a variety of metallic material is used for the insulating layer, a method in which heating is not required such as the sputtering method or the like is applied, while when conductive paste composed of metallic powder and a resin is used for the insulating later, the screen printing method, the coating method, or the like may be preferably used. Moreover, when the insulating layer is formed by glass, it is possible to screen print the conductive paste by the screen printing method or the like and sinter it at a temperature lower than the temperature not allowing the glass to flow.

Figure 27:
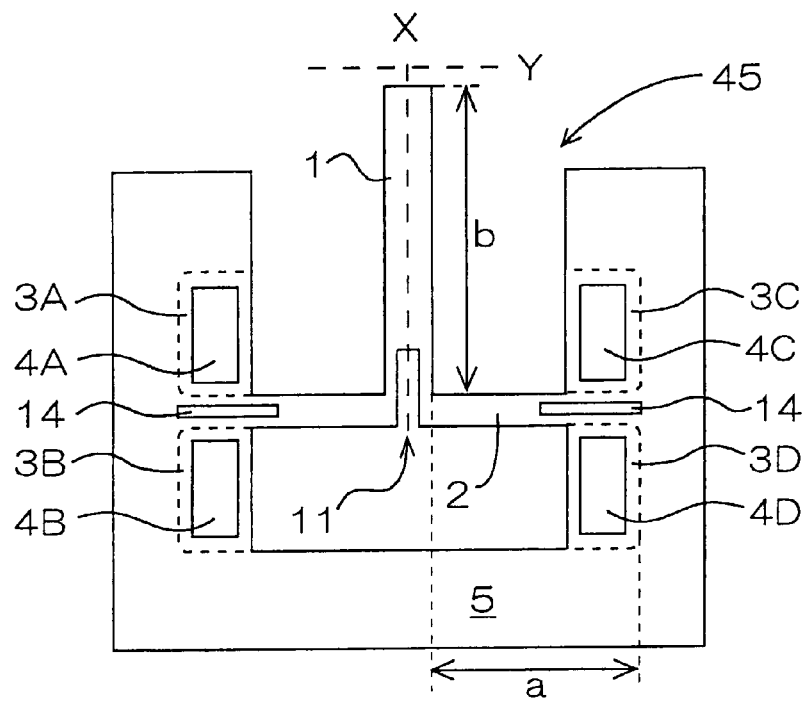
FIG. 27 shows a plan view of a structure relative to an embodiment of a piezoelectric/electrostrictive device of the present invention.

Now, the present invention is further described by still another embodiment. FIG. 27 shows a plan view of a schematic structure of a device 45 fabricated. The device 45 is equivalent to the device 38 which is made to have an aperture slit 14 formed in parallel to the Y-axis direction in a connecting plate 2 thereof. Further, FIG. 27 does not exactly show the measurement relation of respective members of the device 45 actually fabricated.

The device 45 is fabricated with zirconium oxide partially stabilized by yttrium oxide as a material for a substrate 5 and the like by the green sheet laminating method using a variety of sheet members 51 to 53 previously shown in FIG. 24. As the sheet member 51 mainly forming diaphragms 3A to 3D, one having a thickness of 10 $\mu$m after being sintered, as the sheet member 52 mainly forming a connecting plate 2 or the like, one having a thickness of 100 $\mu$m after being sintered, and as the sheet member 53 mainly forming a substrate 5, one having a thickness of 150 $\mu$m after being sintered, are used.

The sheet members 51 to 53 are punched by the punching machining by use of a die from a band-shaped sheet, laminated, subjected to thermo-compression joining, and sintered at 1450° C. In the sheet members 51 to 53, portions to be diaphragms 3A to 3D after sintering are adjusted to be planar by combination of the sintering shrinkage factor and the sintering speed.

As piezoelectric elements 4A to 4D to be arranged on a laminated body after sintering, a piezoelectric element 88 of the structure shown in FIG. 5, utilizing the lateral effect ($d_{31}$) of the piezoelectric induced distortion. Here, a material containing platinum (Pt) as the major component is used for a first electrode (lower electrode) 85, a material containing mixture of lead zirconate, lead titanate, and lead magnesium niobate as the major component is used for a piezoelectric film 86, and a material containing gold (au) as the major component is used for a second electrode (upper electrode), respectively.

Such piezoelectric elements 88 (4A to 4D) are formed by the screen printing method. The first electrode 85 is firstly printed and sintered, then the piezoelectric film 86 is printed and sintered, and the second electrode 87 is lastly printed and sintered. Thickness of the first electrode 85, the piezoelectric film 86, and the second electrode 87 are respectively 5 $\mu$m, 15 $\mu$m, and 0.2 $\mu$m. Moreover, by formation of the piezoelectric element 4A to 4D, diaphragms 3A to 3D, which are convex on the side of the diaphragms as shown in FIG. 4A, and have a curvature having the curvature height H at 10 $\mu$m, are formed. The width of the diaphragms 3A to 3D, namely L in FIG. 4A is 350 $\mu$m, and (H/L)×100 is 2.9.

Then, by use of the fourth harmonics of a YAG laser, diaphragms 3A to 3D, a connecting plate 2, a fixing plate 1, a notch 11, and an aperture slit 14 are formed of a predetermined dimension. The length a of the connecting plate 2 is 1 mm long, the length b of the fixing plate 1 is 1.5 mm, the notch 11 is 10 $\mu$m wide and 0.5 mm long, and the aperture slit 14 is 10 $\mu$m wide and 0.5 mm long. Both the connecting plate 2 and the fixing plate 1 are 60 $\mu$m wide.

Electrode leads are wired to respective electrodes in the piezoelectric elements 4A to 4D, and then the piezoelectric elements 4A to 4D are polarized at 50 V. Displacement quantity (vibration amplitude quantity) of the tip of a fixing plate 1 when the piezoelectric elements 4A to 4D driven in a specific combination to be described later is derived by detecting a speed signal of the Y-axis direction displacement from the right-hand side of the fixing plate 1 in FIG. 27, and a speed signal of the Z-axis direction displacement from a direction perpendicular to the drawing, respectively using a laser Doppler vibrometer, and by integrating the speed signal.

Figure 28:
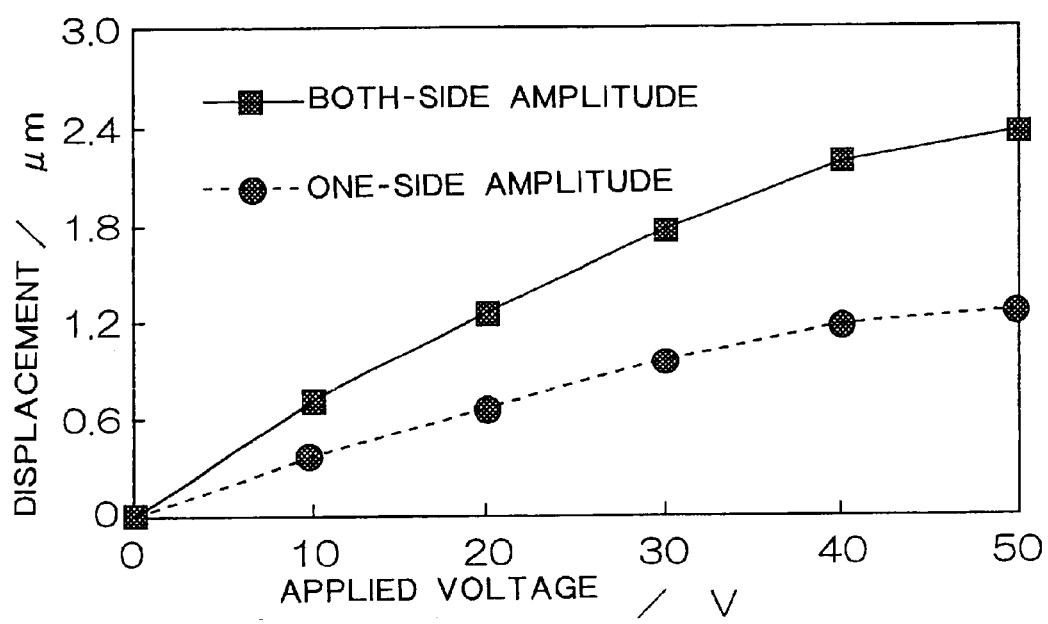
FIG. 28 shows a graph of a result of a driving property of a piezoelectric/electrostrictive device of the present invention.

FIG. 28 is a graph showing an example of the test result of the displacement-voltage characteristic, when driving signals to piezoelectric elements 4A to 4D to be applied at the time of measuring a displacement are made to be the same phase in respective sets of a set of the piezoelectric elements 4A and 4D, and another set of the piezoelectric elements 4B and 4C. In FIG. 28, both side amplitude shows total stroke volume in the Y-axis direction in FIG. 27, when a voltage is alternately applied to the set of the piezoelectric elements 4A and 4D and to the set of the piezoelectric elements 4B and 4C, while one side amplitude shows displacement quantity from the X-axis to the right-hand side of the Y-axis when only the piezoelectric elements 4A and 4D are driven. In the device 45 according to the present invention, displacement quantity is changed substantially linearly, against voltages applied to the piezoelectric elements 4A to 4D, and with an applied voltage of 50 V, the both side amplitude obtained is 2.5 $\mu$m.

Figure 29:
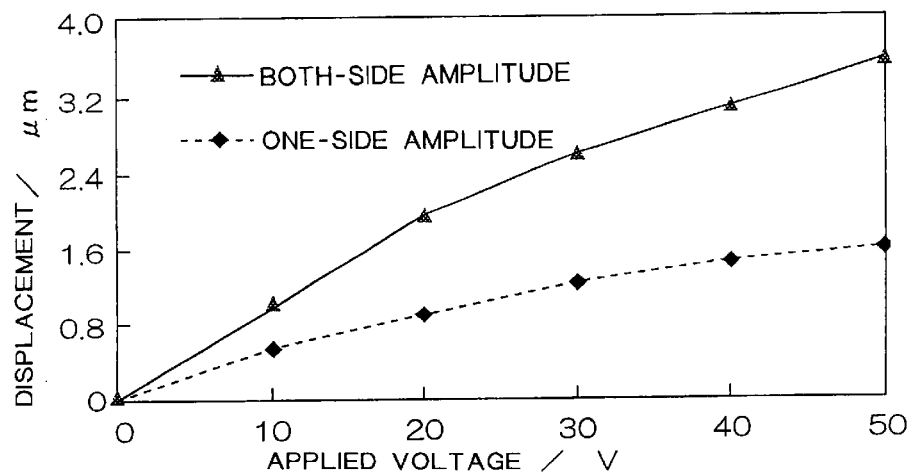
FIG. 29 shows a graph of another result of a driving property of a piezoelectric/electrostrictive device of the present invention.

Now, FIG. 29 shows a graph of the displacement quantity, when the piezoelectric elements 4A and 4D are made as a set, and the piezoelectric elements 4B and 4C are made another set, and a set is applied by an electric field in the same direction as an electric field of the polarization, and another set is applied an electric field in the direction opposite to an electric field of the polarization, respectively and simultaneously. Namely, FIG. 29 shows a graph of a case where the piezoelectric elements 4A and 4D and the piezoelectric elements 4B and 4C are simultaneously driven mutually in opposite phases. Here, in the graph of FIG. 29, an applied voltage in the transverse axis is made to show the applied voltage in the forward direction (the same polarity as the polarization), and an applied voltage in the opposite direction is made to be constantly –5 V. ("–" shows that the polarity of a driving voltage applied is opposite to that of the time of polarization.). It should be noted that an voltage applied in the opposite direction is required to be lower than the coercive electric field of the materials of the piezoelectric film.

When a voltage is applied in this manner, one of the piezoelectric elements 4A and 4B is extended and the other of the same is shrunk, thus a displacement of the one is assisted by a displacement of the other. The state is similar with the piezoelectric elements 4C and 4D, thus the displacement is made larger in FIG. 29 than in FIG. 28, and it is shown that displacement quantity can be adjusted depending on the driving modes of the piezoelectric elements 4A to 4D.

Now, wherein described an example of an embodiment of a method for dominantly displacing a fixing plate 1 in the X-Y plane, with the device 45 as an example. However, the device 45 used here is fabricated by using a sheet member 52 which is 50 $\mu$m thick after being sintered, and the widths of a connecting plate 2 and a fixing plate 1 are both made to be 80 $\mu$m. The displacement quantity is measured by the laser Doppler vibrometer in the similar manner as the previously described the example of embodiment.

Figure 30A:
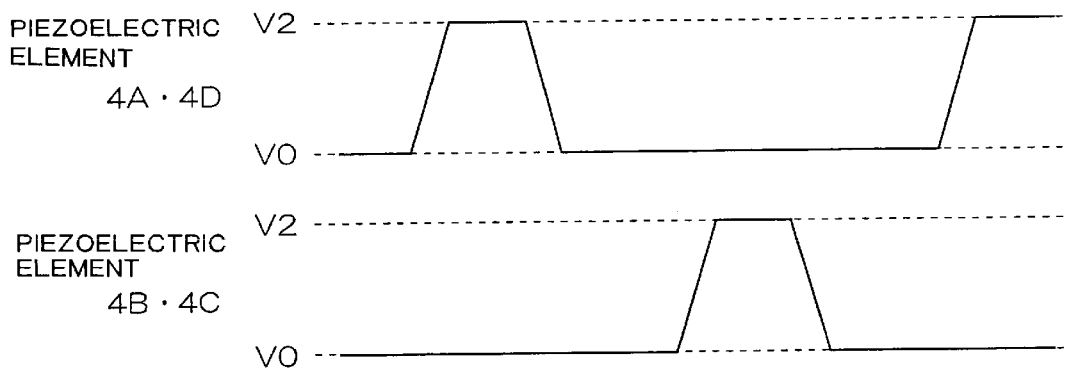
FIGS. 30A and 30B show explanatory diagrams of driving signals of a piezoelectric/electrostrictive device of the present invention.
Figure 30B:
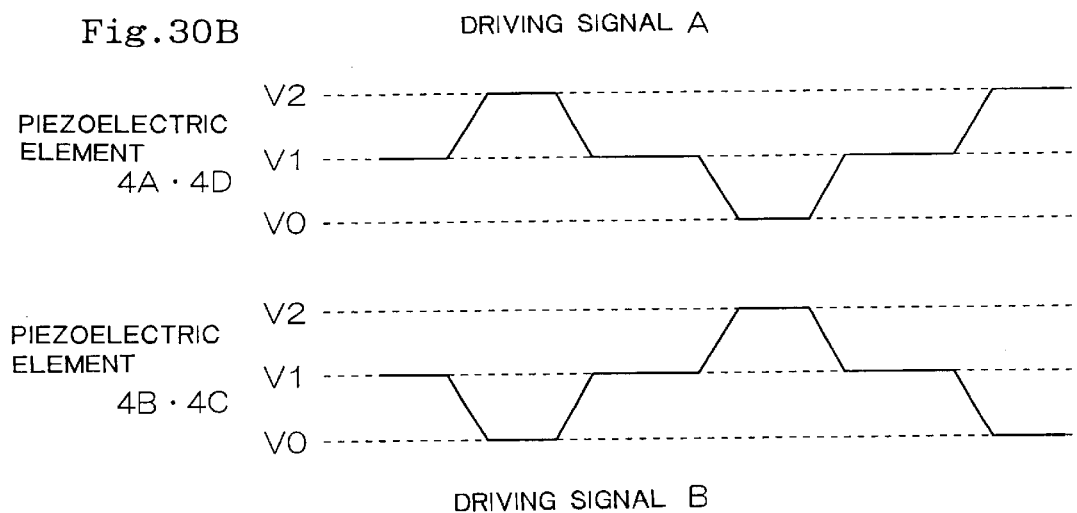

FIGS. 30A and 30B show explanatory views of different aspects (hereinafter described as "driving signal A" and "driving signal B") of a voltage signal to be applied to piezoelectric elements 4A to 4D, and a table 1 describes a component in the axial direction of displacement quantities by the driving signals A and B. As apparent form the table 1, it is understood that generation of the displacement component in the Z-axis direction is suppressed when the driving signal B is used without decreasing the displacement quantity in the Y-axis direction for any driving voltages (V2).

TABLE 1

| | | DRIVING SIGNAL A | | |
|---|---|---|---|---|
| V0 (V) | V1 (V) | V2 (V) | Displacement Quantity In Y-axis Direction (Both Side Amplitude) ($\mu$m) | Displacement Quantity In Z-axis Direction ($\mu$m) |
| 0 | — | 10 | 0.84 | 0.35 |
| 0 | — | 20 | 1.53 | 0.63 |
| 0 | — | 30 | 2.10 | 0.83 |
| 0 | — | 40 | 2.25 | 1.00 |
| 0 | — | 50 | 2.81 | 1.15 |

| DRIVING SIGNAL B | | | | |
|---|---|---|---|---|
| V0 (V) | V1 (V) | V2 (V) | Displacement Quantity In Y-axis Direction (Both Side Amplitude) ($\mu$m) | Displacement Quantity In Z-axis Direction ($\mu$m) |
| 0 | 5 | 10 | 0.83 | 0.01 |
| 0 | 10 | 20 | 1.55 | 0.01 |
| 0 | 15 | 30 | 2.05 | 0.03 |
| 0 | 20 | 40 | 2.48 | 0.04 |
| 0 | 25 | 50 | 2.90 | 0.06 |

Hereinafter, results shown in Table 1 are considered. In order to have a fixing plate 1 driven in the in-plane rotational displacement mode in the device 45, the piezoelectric elements 4A and 4D are made to be a set, and the piezoelectric elements 4B and 4C are made to be another set, and a voltage is applied to the piezoelectric elements 4A to 4D, thus the bending displacements of the piezoelectric elements 4A to 4D are converted into a displacement of the fixing plate 1. At this time, the piezoelectric elements 4A to 4D are deform toward a direction (X-axis Direction) in which a connecting plate 2 is interposed, as well as toward the longitudinal direction (straddling direction, namely the Y-axis direction) of the connecting plate 2.

Although bending displacements of the piezoelectric elements 4A to 4D in the X-axis direction are converted into a displacement of the connecting plate 2 in the X-axis direction, as diaphragms 3A to 3D are joined with the connecting plate 2 and the substrate 5, as for the Y-axis direction, the one sides are made to be free ends as beams, and as the result, bending displacements of the piezoelectric elements 4A to 4D in the Y-axis direction make the connecting plate 2 to displace in the Z-axis direction. Accordingly, when no specific invention is performed particularly about the design of the shape and the driving mode of the piezoelectric elements, the fixing plate 1 is made to displace in the Z-axis direction in not a small magnitude.

Here, as long as the shapes of a piezoelectric operating portions are the same, and the voltages applied to piezoelectric elements are the same, the displacement quantities in the Z-axis direction are the same for the cases where the piezoelectric elements 4A and 4D are driven, and where the piezoelectric elements 4B and 4C are driven, the occasion when the displacement in the Z-axis direction is the minimum, namely the displacement quantity in the Z-axis direction is also zero, is when the displacement of the fixing plate 1 in the Y-axis direction is also zero. It is conceivable that the state can be realized at least in two cases, namely when no voltage is applied to the piezoelectric elements 4A to 4D, or when the equivalent voltages are applied to the set of the piezoelectric elements 4A and 4D and the another set of the piezoelectric elements 4B and 4C, thus the driving forces from the respective sets to the fixing plate 1 are made mutually competitive to be neutral.

Then, even if the displacement quantity in the Y-axis direction of the fixing plate 1 is the same zero, there exists a state where the absolute position in the Z-axis direction is different. For example, if a displacement in the Z-axis direction corresponding to the displacement in the Z-axis direction in the case when only the set of the piezoelectric elements 4A and 4D is driven is obtained in the stand-by state of zero displacement in the Y-axis direction when equivalent voltages are applied across all piezoelectric elements 4A to 4D, the displacement quantity in the Z-axis direction between these two states becomes zero. On the other hand, a displacement quantity in the Z-axis direction when the displacement quantity in the Y-axis direction is made zero by applying the equivalent voltages across all piezoelectric elements becomes large when the voltage of the equivalent voltages are high, and becomes small when the voltage of the equivalent voltages are low, thus, by changing the value of the voltage to be applied to respective sets of the piezoelectric elements, the displacement quantity in the Z-axis direction is made to be controllable.

Accordingly, between the cases when the displacement quantity in the Y-axis direction is the maximum and the minimum, namely over entire range where the fixing plate 1 can displace, a drive having the relative displacement quantity in the Z-axis direction at zero is made possible. In other words, such a drive is performed such that the total voltage applied to the piezoelectric elements of respective sets becomes to be constant at the maximum driving voltage. However, in reality, there are occasions when the relative displacement quantity in the Z-axis direction can not necessarily be zero by making the total voltage to be constant, depending on variations in dimensions of respective members of the device and variations in the characteristics of the piezoelectric elements, adjustment is required each time.

Shapes, materials, and methods of fabrication of a piezoelectric/electrostrictive device of the present invention are described in detail. However, it goes without saying that the present invention is not limited to the above embodiments, and it should be understood that the present invention allows a modified, corrected, or improved embodiment in accordance with the knowledge of a person of ordinary skill in the art as long as the embodiment is not deviated from the gist of the present invention, in addition to the above described embodiments.

As it is made clear in the above description, a piezoelectric/electrostrictive device of the present invention has features that the structure is simple, and the device can easily be compactified and made lighter in weight, and that the device is power saving as well as high in the displacement efficiency, and it is scarcely influenced by harmful vibrations from the outside. Moreover, the device has features that control in high precision is made possible for both a static displacement and a dynamic displacement, and a displacement in large magnitude can be obtained with ease, and moreover, the device can be used also as a sensor, and in the case the sensitivity thereof can be raised. Furthermore, by using a simple method of fabrication such as the green sheet laminating method, an advantage is obtained that the device can be economically fabricated while improving reliability as an integrated structure. Furthermore, another advantage obtainable is that the allowable range for selection of the composing materials is wide, and a suitable material can be used in accordance with the purpose at any time. Therefore, when incorporating the device into a variety of actuators and sensors, the device manifests an advantage the actuators and the sensors are enabled to control and measure in higher precision, and the device contributes to compactification and lightening of the weight thereof.

What is claimed is:

1. A piezoelectric/electrostrictive device wherein a connecting plate, a diaphragm, and a substrate are mutually joined such that a joining direction of said connecting plate with said substrate and a joining direction of said connecting plate with said diaphragm are mutually intersected to form a cross and said diaphragm is spanned between said connecting plate and said substrate, a piezoelectric/electrostrictive element is arranged on at least a part of at least one surface of said diaphragm, and said diaphragm is convexly curved in a direction perpendicular to two directions by which said cross is formed.

2. A piezoelectric/electrostrictive device according to claim 1, wherein a fixing plate is joined with an end of said connecting plate.

3. A piezoelectric/electrostrictive device according to claim 2, wherein a plurality of connecting plates and fixing plates are joined in a meandering shape, and a diaphragm is straddled between each set of neighboring connecting plates.

4. A piezoelectric/electrostrictive device according to claim 1, wherein a joined surface of said connecting plate with said substrate is made to be a fixing face, a central axis perpendicularly penetrating through the center of said fixing face is made to be a reference, and said connecting plate displaces in at least any of the displacement modes of:
- a θ displacement mode where said connecting plate swingably displaces in a joining direction of said connecting plate with said diaphragm,
- a φ displacement mode where a displacement component in a direction perpendicular to both a joining direction of said connecting plate with said diaphragm and an extending direction of said central axis is added to said θ displacement mode as away from said central axis,
- a ν displacement mode where said connecting plate uniaxially displaces in a joining direction of said connecting plate with said diaphragm, or
- a νz displacement mode where a displacement component in a direction perpendicular to both a joining direction of said connecting plate with said diaphragm and an extending direction of said central axis is added to said ν displacement mode as away from said central axis.

5. A piezoelectric/electrostrictive device, wherein a fixing plate, a connecting plate, and a diaphragm are mutually joined such that a direction where said connecting plate sandwiches said fixing plate and a direction where said diaphragm sandwiches said connecting plate are mutually intersected to form a cross,
said connecting plate is spanned between bottom surfaces of opposite recess portions formed on a substrate, and said diaphragm is joined with sides of said recess portions,
a piezoelectric/electrostrictive element is arranged on at least a part of at least one surface of said diaphragm, and the diaphragm with said piezoelectric/electrostrictive element arranged thereon is convexly curved in a direction perpendicular to two directions by which said cross is formed.

6. A piezoelectric/electrostrictive device according to claim 5, wherein said diaphragm is arranged to be joined also with said fixing plate.

7. A piezoelectric/electrostrictive device according to claim 5, wherein said fixing plate displaces in either of displacement modes which are displacements in a planar direction of said fixing plate, the displacement modes being:
- a uniaxial displacement mode where said fixing plate uniaxially displaces in a direction parallel to the direction in which said diaphragm interposes said connecting plate, or
- a rotational displacement mode where said fixing plate rotates about a substantially central position of said fixing plate.

8. A piezoelectric/electrostrictive device according to claim 1, wherein said connecting plate has one or more slits and/or holes formed thereon and/or a thin portion and a thick portion formed thereon.

9. A piezoelectric/electrostrictive device according to claim 5, wherein said connecting plate has one or more slits and/or holes formed thereon and/or a thin portion and a thick portion formed thereon.

10. A piezoelectric/electrostrictive device wherein a connecting plate is straddled between bottom surfaces of opposite recess portions formed on a substrate,
in respective recess portions, at least one diaphragm is straddled between said connecting plate and a side of said recess portion,
a fixing plate is joined with the connecting plate such that a longitudinal direction of said fixing plate is in parallel with a straddling direction of said diaphragm, and
a piezoelectric/electrostrictive element is arranged on at least a part of at least one surface of said at least one diaphragm, and said diaphragm is convexly curved in a direction perpendicular to both directions of a straddling direction of said diaphragm and a straddling direction of said connecting plate.

11. A piezoelectric/electrostrictive device wherein a connecting plate, one end thereof in a longitudinal direction is interposed by at least two diaphragms, and the other end thereof is interposed by at least another two diaphragms, is spanned between bottom surfaces of opposite recess portions formed on a substrate, and said diaphragms are joined with sides of said recess portions,
a fixing plate is joined with said connecting plate such that a longitudinal direction of said fixing plate is made to be in parallel with a direction in which said diaphragms span said connecting plate, and
a piezoelectric/electrostrictive element is arranged on at least a part of at least one surface of at least two of said diaphragms, and said at least two of said diaphragms are convexly curved in a direction perpendicular to both a direction in which said diaphragm interposes said connecting plate and a straddling direction of said connecting plate.

12. A piezoelectricle/ectrostrictive device according to claim 10, wherein a notch is formed at a joint of said fixing plate with said connecting plate.

13. A piezoelectric/electrostrictive device according to claim 11, wherein a notch is formed at a joint of said fixing plate with said connecting plate.

14. A piezoelectric/electrostrictive device according to claim 11, wherein said fixing plate is joined so as to be intersected with said connecting plate.

15. A piezoelectric/electrostrictive device according to claim 11, wherein said connecting plate is split into at least two in a longitudinal direction of said fixing plate, and at least two connecting plates which are formed by splitting are joined with said fixing plate.

16. A piezoelectric/electrostrictive device according to claim 12, wherein a hinge is provided on said fixing plate from a joint of said fixing plate with said connecting plate along a longitudinal direction of said fixing plate.

17. A piezoelectric/electrostrictive device according to claim 11, wherein one set of piezoelectric/electrostrictive elements which are positioned in diagonal positions are driven in the same phase about a joint of said fixing plate with said connecting plate as the center, and the other set of piezoelectric/electrostrictive elements ate driven in an opposite phase, or said one set of piezoelectric/electrostrictive elements and the other set of piezoelectric/electrostrictive elements are driven in the same phase with a shifted time.

18. A piezoelectric/electrostrictive device according to claim 11, wherein one set of piezoelectric/electrostrictive elements which are positioned in an axial symmetry to an axis of said fixing plate in a longitudinal direction are driven in the same phase and the other set of piezoelectric/electrostrictive elements are driven in an opposite phase, or said one set of piezoelectric/electrostrictive elements and said other set of piezoelectric/electrostrictive elements are driven in the same phase with a shifted time.

19. A piezoelectric/electrostrictive device according to claim 11, wherein said at least two diaphragms are respectively joined with said connecting plate at positions shifted in a thickness direction of said connecting plate.

20. A piezoelectric/electrostrictive device according to claim 19, wherein a piezoelectric/electrostrictive element is arranged on one surface of said respective diaphragms about the middle point of a joining position of a pair of diaphragms interposing said connecting plate with said connecting plate as the center of point symmetry, and said piezoelectric/electrostrictive element is driven in the same phase.

21. A piezoelectric/electrostrictive device according to claim 11, wherein used is at least any one of the displacement modes of:
 a uniaxial displacement mode in which displacement is performed uniaxially in a longitudinal direction of said fixing plate,
 an in-plane rotational displacement mode having vicinity of a joint of said fixing plate with said connecting plate as the center, or
 an axially rotational displacement mode having an axis of said connecting plate in a longitudinal direction as the rotational center.

22. A piezoelectric/electrostrictive device according to claim 21, wherein said in-plane rotational displacement mode is based on an enlarging mechanism for enlarging a displacement of said piezoelectric/electrostrictive element in two stages.

23. A piezoelectric/electrostrictive device according to claim 11, wherein one fixing plate is joined with connecting plates of a number of piezoelectric/electrostrictive devices.

24. A piezoelectric/electrostrictive device according to claim 11, wherein, when a length of said diaphragm in a straddling direction is set to be L, and a height of a curvature in a convex direction is set to be H, at least a relation of $1 \leq (H/L) \times 100 \leq 30$ is satisfied.

25. A piezoelectric/electrostrictive device according to claim 11, wherein at least said connecting plate and said diaphragm are joined on mutual sides.

26. A piezoelectric/electrostrictive device according to claim 11, wherein at least said connecting plate and said diaphragm and said substrate are integrally formed.

27. A piezoelectric/electrostrictive device according to claim 26, wherein at least the connecting plate and the diaphragm and the substrate are fabricated by use of the green sheet laminating method.

28. A piezoelectric/electrostrictive device according to claim 11, wherein at least two piezoelectric/electrostrictive elements are formed by splitting said piezoelectric/electrostrictive element into a plurality of piezoelectric/electrostrictive elements, and one is used as a driving element, and at least one of the other piezoelectric/electrostrictive elements is used as an auxiliary element.

29. A piezoelectric/electrostrictive device according to claim 11, comprising two or more piezoelectric/electrostrictive elements, at least one of said piezoelectric/electrostrictive elements is used as a driving element, and at least one of the other piezoelectric/electrostrictive elements is used as an auxiliary element.

30. A piezoelectric/electrostrictive device according to claim 11, wherein an electrode lead conducted to said piezoelectric/electrostrictive element and an electrode of said piezoelectric/electrostrictive element are coated by an insulating layer composed of a resin or glass.

31. A piezoelectric/electrostrictive device according to claim 30, wherein said resin is a fluororesin or a silicone resin.

32. A piezoelectric/electrostrictive device according to claim 30, wherein a shielding layer composed of a conductive material is further formed on a surface of said insulating layer.

33. A piezoelectric/electrostrictive device according to claim 11, wherein at least said substrate, said connecting plate, and said diaphragm are composed of fully-stabilized zirconia or partially-stabilized zirconia.

34. A piezoelectric/electrostrictive device according to claim 11, wherein a piezoelectric film in said piezoelectric/electrostrictive element is composed of a material containing a component composed of lead zirconate, lead titanate, and lead magnesium niobate as the major component.

35. A piezoelectric/electrostrictive device according to claim 11, wherein the shape of said fixing plate, said connecting plate, and said diaphragm are dimension-adjusted by trimming by way of laser machining or mechanical machining.

36. A piezoelectric/electrostrictive device according to claim 11, wherein an electrode in said piezoelectric/electrostrictive element is subjected to laser machining or mechanical machining, and an available electrode area of said piezoelectric/electrostrictive element is adjusted.

* * * * *